US012672309B2

(12) United States Patent
Xie et al.

(10) Patent No.: US 12,672,309 B2
(45) Date of Patent: Jun. 30, 2026

(54) SEMICONDUCTOR STRUCTURES WITH WRAP-AROUND CONTACT STRUCTURE

(71) Applicant: International Business Machines Corporation, Armonk, NY (US)

(72) Inventors: Ruilong Xie, Niskayuna, NY (US); Jingyun Zhang, Albany, NY (US); Reinaldo Vega, Mahopac, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 553 days.

(21) Appl. No.: 17/550,724

(22) Filed: Dec. 14, 2021

(65) Prior Publication Data

US 2023/0187508 A1      Jun. 15, 2023

(51) Int. Cl.
| | |
|---|---|
| *H10D 64/01* | (2025.01) |
| *H10D 30/67* | (2025.01) |
| *H10D 62/13* | (2025.01) |
| *H10D 30/01* | (2025.01) |

(52) U.S. Cl.
CPC ....... *H10D 30/6729* (2025.01); *H10D 62/151* (2025.01); *H10D 64/01* (2025.01); *H10D 64/017* (2025.01); *H10D 30/031* (2025.01); *H10D 30/6735* (2025.01); *H10D 30/6757* (2025.01)

(58) Field of Classification Search
CPC .. H10D 30/6729; H10D 62/151; H10D 64/01; H10D 30/031; H10D 30/6735; H10D 64/256; H10D 62/364; H10D 84/0149
See application file for complete search history.

(56) References Cited

U.S. PATENT DOCUMENTS

| | | | |
|---|---|---|---|
| 9,397,197 B1 | 7/2016 | Guo et al. | |
| 9,484,348 B2 | 11/2016 | Basker et al. | |
| 9,847,390 B1 | 12/2017 | Xie et al. | |
| 9,947,804 B1 * | 4/2018 | Frougier | H10D 30/6743 |
| 10,084,094 B1 | 9/2018 | Cheng et al. | |
| 10,170,638 B1 * | 1/2019 | Reznicek | H10D 30/6757 |
| 10,192,867 B1 | 1/2019 | Frougier et al. | |
| 10,236,218 B1 | 3/2019 | Xie et al. | |
| 10,903,315 B2 | 1/2021 | Loubet et al. | |
| 11,152,489 B2 | 10/2021 | Bao et al. | |
| 2016/0240775 A1 * | 8/2016 | Hsiao | H10B 63/30 |
| 2018/0006159 A1 | 1/2018 | Guillorn et al. | |
| 2018/0269305 A1 | 9/2018 | Bao et al. | |

(Continued)

OTHER PUBLICATIONS

J.-S. Yoon et al., "Metal Source-/Drain-Induced Performance Boosting of Sub-7-nm Node Nanosheet FETs," IEEE Transactions on Electron Devices, Apr. 2019, vol. 66, No. 4, pp. 1868-1873.

*Primary Examiner* — Marlon T Fletcher
*Assistant Examiner* — Da Wei Lee
(74) *Attorney, Agent, or Firm* — Samuel Waldbaum; Ryan, Mason & Lewis, LLP

(57) ABSTRACT

A semiconductor structure includes a source/drain region having a recessed portion. The semiconductor structure further includes a metal contact having a first portion and a second portion. The first portion of the metal contact has a first width and the second portion of the metal contact has a second width greater than the first width. At least a portion of the second portion of the metal contact is disposed in the recessed portion of the source/drain region.

20 Claims, 28 Drawing Sheets

Y-Y

(56)         References Cited

U.S. PATENT DOCUMENTS

2018/0374958  A1     12/2018  Guillorn et al.
2019/0081145  A1      3/2019  Xie et al.
2020/0266271  A1*     8/2020  Lin ...................... H10D 62/121
2022/0359684  A1*    11/2022  Hsiung ............. H10D 30/6219

* cited by examiner

X-X

Y-Y

X-X

Y-Y

Y-Y

X-X

X-X

Y-Y

Y-Y

X-X

X-X

Y-Y

Y-Y

X-X

Y-Y

X-X

Y-Y

X-X

Y-Y

X-X

Y-Y

X-X

Y-Y

X-X

Y-Y

X-X

X-X

Y-Y

Y-Y

X-X

Y-Y

X-X

Y-Y

X-X

Y-Y

X-X

Y-Y

X-X

Y-Y

X-X

Y-Y

X-X

Y-Y

X-X

X-X

Y-Y

Y-Y

X-X

Y-Y

X-X

Y-Y

X-X

Y-Y

X-X

Y-Y

X-X

SEMICONDUCTOR STRUCTURES WITH WRAP-AROUND CONTACT STRUCTURE

BACKGROUND

This disclosure relates generally to semiconductor fabrication techniques and, in particular, to structures and methods for fabricating semiconductor devices. The semiconductor integrated circuit (IC) industry has experienced rapid growth. In the course of the IC evolution, functional density (i.e., the number of interconnected devices per chip area) has generally increased while geometry size (i.e., the smallest component (e.g., line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

SUMMARY

According to an exemplary embodiment, a semiconductor structure comprises a source/drain region comprising a recessed portion. The semiconductor structure further comprises a metal contact having a first portion and a second portion. The first portion of the metal contact has a first width and the second portion of the metal contact has a second width greater than the first width. At least a portion of the second portion of the metal contact is disposed in the recessed portion of the source/drain region.

According to an exemplary embodiment, an integrated circuit comprises a plurality of semiconductor structures. At least one semiconductor structure of the plurality of semiconductor structures comprises a source/drain region comprising a recessed portion. The semiconductor structure further comprises a metal contact having a first portion and a second portion. The first portion of the metal contact has a first width and the second portion of the metal contact has a second width greater than the first width. At least a portion of the second portion of the metal contact is disposed in the recessed portion of the source/drain region.

According to an exemplary embodiment, a method comprises forming a source/drain region comprising a recessed portion. The method further comprises forming a metal contact on the source/drain region. The metal contact has a first portion and a second portion. The first portion of the metal contact has a first width and the second portion of the metal contact has a second width greater than the first width. At least a portion of the second portion of the metal contact is formed in the recessed portion of the source drain region.

These and other exemplary embodiments will be described in or become apparent from the following detailed description of exemplary embodiments, which is to be read in connection with the accompanying drawings.

BRIEF DESCRIPTION OF THE DRAWINGS

Exemplary embodiments will be described below in more detail, with reference to the accompanying drawings, of which.

DETAILED DESCRIPTION

Figures 1A, 1B, 1C:
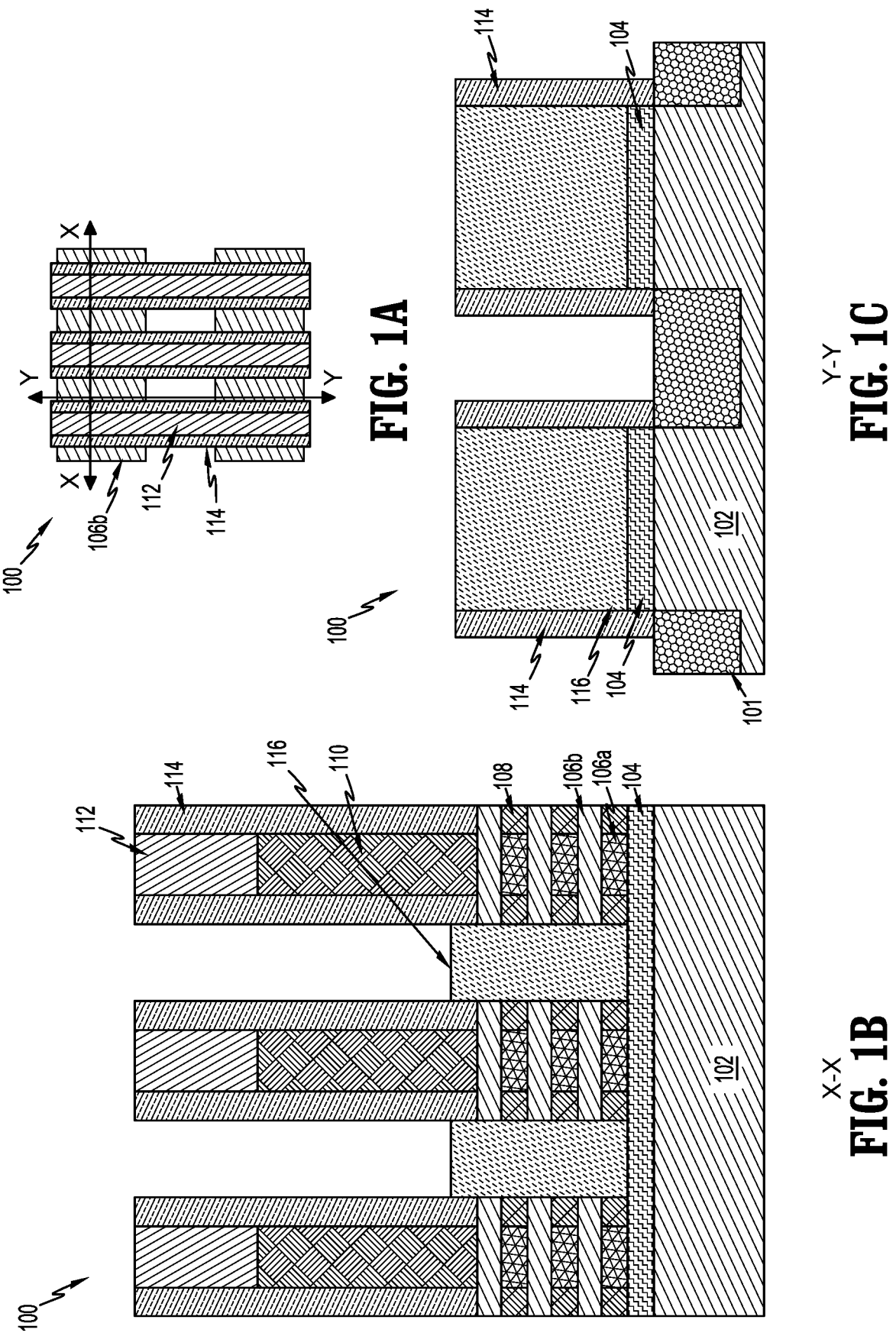
FIG. 1A is a top view illustrating the semiconductor structure at a first-intermediate fabrication stage, according to an illustrative embodiment.
FIG. 1B is a cross-sectional view illustrating the semiconductor structure taken along the X-X axis of FIG. 1A at the first-intermediate fabrication stage, according to an illustrative embodiment.
FIG. 1C is a cross-sectional view of the semiconductor structure taken along the Y-Y axis of FIG. 1A at the first-intermediate fabrication stage, according to an illustrative embodiment.

This disclosure relates generally to transistors, and more particularly to semiconductor devices and methods for their fabrication. For example, a field effect transistor (FET) is a semiconductor device that controls the electrical conductivity between a source of electric current (source) and a destination of the electrical current (drain). The FET uses a semiconductor structure called a gate to create an electric field, which controls the shape and consequently the electrical conductivity of a channel between the source and the drain. The channel is a charge carrier pathway constructed using a semiconductor material. A nanosheet FET transistor typically includes a substrate, an isolation layer, a number of vertically stacked nanosheets forming a channel, and a gate. A nanosheet is formed of a thin layer of semiconductor channel material having a vertical thickness that is less than a width of the material.

Another example is a fin-type field effect transistor (FinFET) device. Known FinFET devices include fins with source/drain regions on lateral sides of the fins, so that current flows in a horizontal direction (e.g., parallel to a substrate) between source/drain regions at opposite ends of the fins in the horizontal direction.

Exemplary embodiments will now be discussed in further detail with regard to semiconductor devices and methods of manufacturing same and, in particular, to forming a wrap-around-contact for source/drain regions without increasing the parasitic capacitance between the metal contact and gate.

Wrap-around-contact is an attractive feature for future technology. The wrap-around-contact for source/drain regions increases the contact area, so the contact resistance between the wrap-around-contact and the source/drain region is reduced. However, a problem associated with a wrap-around-contact is that the contact size is increased which increases the parasitic capacitance between the S/D contact metal and gate. In addition, there are a few process challenges with conventional wrap-around-contacts. For example, wrap-around-contact fabrication either requires an epitaxial ("epi") sacrificial layer, which has problems such as, for example, (a) Ge diffusion, and (b) non-unform epi growth. In addition, wrap-around-contact fabrication can also be achieved by an atomic layer deposition (ALD) sacrificial liner-based approach, but it requires additional cut processes to separate devices. Finally, even if a wrap-around-contact is formed, it gives additional parasitic capacitance between the metal contact and gate due to the long wrap contact edge.

Contact resistance is of a concern as transistor device scaling continues beyond the 5 nm technology node. The term contact resistance is the contribution to the total resistance of a material in which total resistance comes from the electrical leads and connections, as opposed to the intrinsic resistance that is an inherent property independent of the measurement method. Accordingly, illustrative non-limiting embodiments described herein correspond to semiconductor devices with a recessed inner portion of a top surface of a source/drain region and metal contact that overcome the problems discussed above.

It is to be understood that the various layers and/or regions shown in the accompanying drawings are not drawn to scale, and that one or more layers and/or regions of a type commonly used in, for example, field-effect transistor (FET), FinFET, VFET, CMOS, nanowire FET, nanosheet FETs, metal-oxide-semiconductor field-effect transistor (MOSFET), single electron transistor (SET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the terms "about" or "substantially" as used herein imply that a small margin of error may be present, such as 1% or less than the stated amount.

The semiconductor devices and methods for forming same in accordance with embodiments described herein can be employed in applications, hardware, and/or electronic systems. Suitable hardware and systems for implementing illustrative embodiments may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments. Given the teachings of illustrative embodiments provided herein, one of ordinary skill in the art will be able to contemplate other implementations and applications of embodiments described herein.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

Referring now to the drawings in which like numerals represent the same of similar elements, FIGS. 1A-28B illustrate various processes for fabricating a semiconductor structure. Note that the same reference numeral (100) is used to denote the semiconductor structure through the various intermediate fabrication stages illustrated in FIGS. 1A-13B, and the same reference numeral (200) is used to denote the semiconductor structure through the various intermediate fabrication stages illustrated in FIGS. 14A-28B. Note also that the semiconductor structure described herein can also be considered to be a semiconductor device and/or an integrated circuit, or some part thereof. For the purpose of clarity, some fabrication steps leading up to the production of the semiconductor structures as illustrated in FIGS. 1A-28B are omitted. In other words, one or more well-known processing steps which are not illustrated but are well-known to those of ordinary skill in the art have not been included in the figures. This is not intended to be interpreted as a limitation of any particular embodiment, or illustration, or scope of the claims.

Referring now to illustrative non-limiting embodiment of FIGS. 1A-13B, FIGS. 1A-1C illustrate semiconductor structure 100 at a first-intermediate fabrication stage. FIGS. 1A-1C show a semiconductor structure 100 with substrate 102. In general, substrate 102 can be composed of any currently known or later developed semiconductor material. In one embodiment, the substrate 102 can be a silicon (Si) substrate, although other materials can be used.

Semiconductor structure 100 further includes bottom dielectric isolation (BDI) layer 104 on top of the substrate 102 so as to be under the channel region (or fin-like structure) composed of sacrificial layers 106a alternatingly formed with channel layers 106b. Although three channel layers 106b are shown, any number of channel layers 106b can be used, and the number of sacrificial layers 106a will be increased or decreased accordingly. The material of the sacrificial layers 106a can include $SiGe_x$ % where the atomic percent % for "x" ranges from about 15 to about 35% atomic percent. The material of the channel layers 106b can include Si. The thickness or height of the BDI layer 104 can range from about 5 nm to about 15 nm, the height of each sacrificial layer 106a can range from about 5 nm to about 15 nm, and the height of each channel layer 106b can range from about 5 nm to about 15 nm. Representative examples of $SiGe_x$ can be, for example, $SiGe_{20}$, $SiGe_{25}$, $SiGe_{30}$ . . . $SiGe_{35}$.

Sacrificial layers 106a are disposed between inner spacers 108. Inner spacers 108 can be composed of any suitable dielectric material, for example silicon nitride, silicon oxide, silicon dioxide, silicon oxynitride, SiCN, SiOCN, SiOC, SiBCN, a dielectric metal oxide, a dielectric metal nitride, or a combination thereof. In one embodiment, the dielectric material is silicon nitride.

A shallow trench isolation (STI) region 101 can be formed in substrate 102 (FIG. 1C). STI region 101 comprises a dielectric material such as silicon oxide or silicon oxynitride, and is formed by methods known in the art. For example, in one illustrative embodiment, STI region 101 is a shallow trench isolation oxide layer.

Semiconductor structure 100 further includes dummy gate 110 on the top most channel layer 106b. Suitable dummy gate material includes, for example, polycrystalline silicon, amorphous silicon or microcrystal silicon. The dummy gate material can then be subjected to a planarizing process such as a chemical mechanical planarization (CMP) operation. A thin dummy gate oxide layer (not shown) can be disposed between the dummy gate and nanosheet stack.

Semiconductor structure 100 further includes gate hardmask 112 on dummy gate 110 and sidewall spacer 114 disposed on the exterior sidewall surfaces of dummy gate 110 and gate hardmask 112. Suitable material for gate hardmask 112 includes, for example, $Si_3N_4$, SiBCN, SiNC, SiN, SiCO, $SiO_2$, and SiNOC.

BDI layer 104 can be formed by initially depositing a sacrificial bottom isolation layer on substrate 102. The sacrificial bottom isolation layer is a material that can be removed (i.e., etched) without etching the sacrificial layers 106a and channel layers 106b in the stack. That is, the sacrificial bottom isolation layer can be etched/removed without removing the sacrificial layers 106a alternatingly formed with channel layers 106b. The sacrificial bottom isolation layer can be silicon germanium (SiGe). To cause the sacrificial bottom isolation layer to be removed/etched without etching the other layers, the sacrificial bottom isolation layer can be SiGey % where the atomic percent % for "y" ranges from 50-70% atomic percent.

After gate patterning using gate hardmask 112, the sacrificial isolation layer will be removed by selective etching processes and the cavity is replaced with a dielectric fill to form BDI 104. In one embodiment, the BDI layer 104 can be formed during sidewall spacer 114 deposition. In some other embodiments, the BDI layer 104 can be different material than sidewall spacer 114. In one illustrative embodiment, the BDI layer 104 and sidewall spacer 114 can independently be a nitride or an oxynitride such as, for example, $Si_3N_4$, SiBCN, SiNC, SiN, SiCO, $SiO_2$ and SiNOC. In some exemplary embodiments, sidewall spacer 114 can include a material that is resistant to some etching processes such as, for example, HF chemical etching or chemical oxide removal etching.

Semiconductor structure 100 further includes source/drain region 116 on BDI layer 104. For example, source/drain region 116 is formed on BDI layer 104, around the sidewalls of channel layer 106b, inner spacers 108 and on a portion of sidewall spacer 114. The source/drain regions 116 can be epitaxially grown and in-situ doped, meaning dopants are incorporated into the epitaxy film during the epitaxy process. Other alternative doping techniques can be used, including but not limited to, for example, ion implantation, gas phase doping, plasma doping, plasma immersion ion implantation, cluster doping, infusion doping, liquid phase doping, solid phase doping, etc. Suitable dopants include, for example, an n-type dopant selected from a group of phosphorus (P), arsenic (As) and antimony (Sb), or a p-type dopant selected from a group of boron (B), gallium (Ga), indium (In), and thallium (Tl) at various concentrations. For example, in a non-limiting example, a dopant concentration range may be $1 \times 10^{18}/cm^3$ to $1 \times 10^{21}/cm^3$. It is to be understood that the term "source/drain region" as used herein means that a given source/drain region can be either a source region or a drain region, depending on the application.

Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a $\{100\}$ crystal surface will take on a $\{100\}$ orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RT-CVD), low-energy plasma deposition (LEPD), ultra-high vacuum chemical vapor deposition (UHVCVD), atmospheric pressure chemical vapor deposition (APCVD), and molecular beam epitaxy (MBE). The temperature for an epitaxial deposition process can range from about 500° C. to about 900° C. Although higher temperature typically results in faster deposition, the faster deposition may result in crystal defects and film cracking.

Figures 2A, 2B:
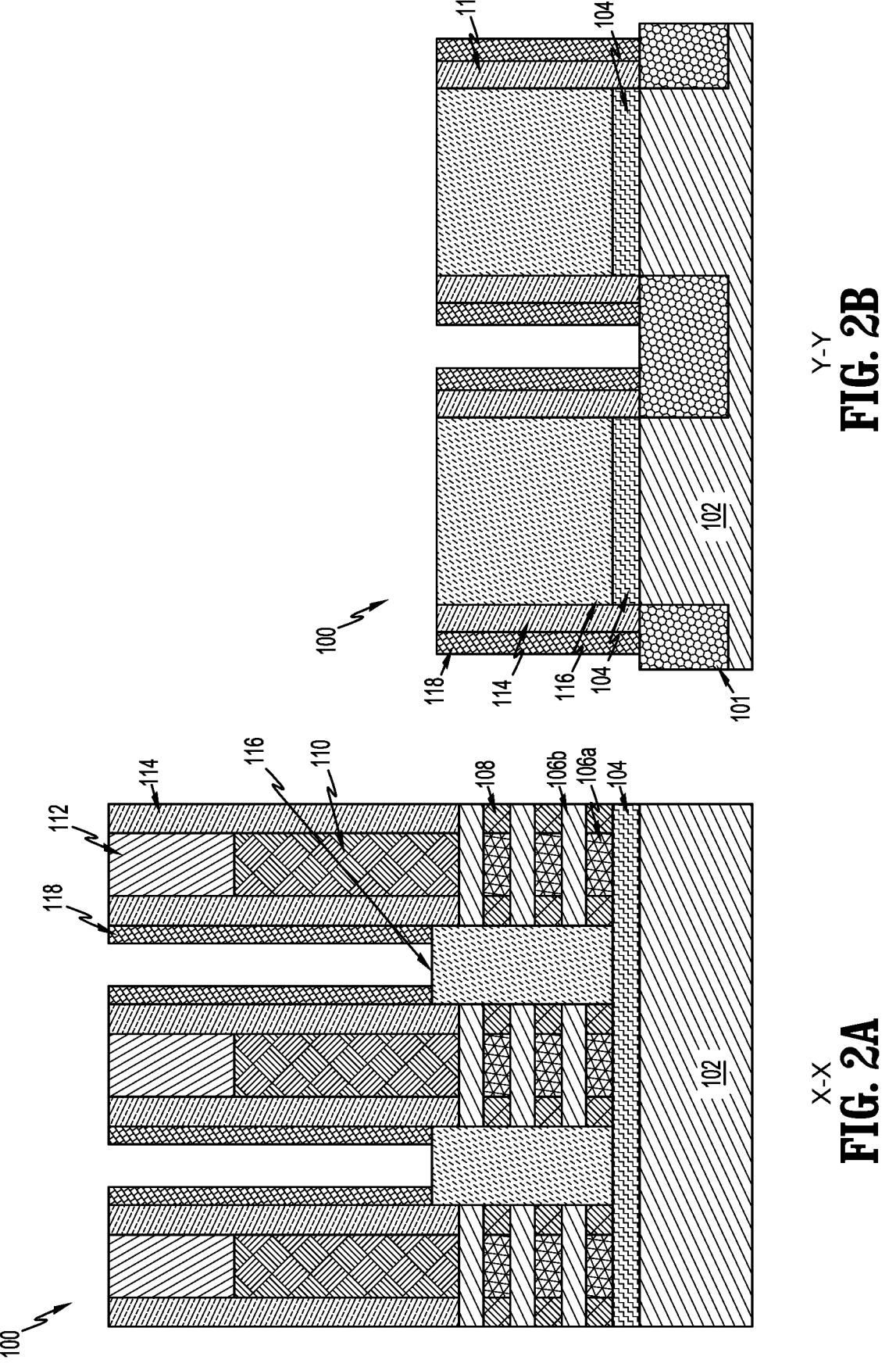
FIG. 2A is a cross-sectional view illustrating the semiconductor structure taken along the X-X axis of FIG. 1A at a second-intermediate fabrication stage, according to an illustrative embodiment.
FIG. 2B is a cross-sectional view of the semiconductor structure taken along the Y-Y axis of FIG. 1A at the second-intermediate fabrication stage, according to an illustrative embodiment.

FIGS. 2A and 2B illustrate semiconductor structure 100 at a second-intermediate fabrication stage. During this stage, sacrificial liner layer 118 is disposed on sidewall spacer 114 and on a portion of source/drain region 116 (FIG. 2A) and STI region 101 (FIG. 2B). Sacrificial liner layer 118 can be deposited by, for example, chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RT-CVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation. Following deposition of the sacrificial liner layer 118, an anisotropic etch can be carried out to remove any liner material from the horizontal surfaces Suitable material for sacrificial liner layer 118 includes, for example, TiOx and SiC.

Figures 3A, 3B:
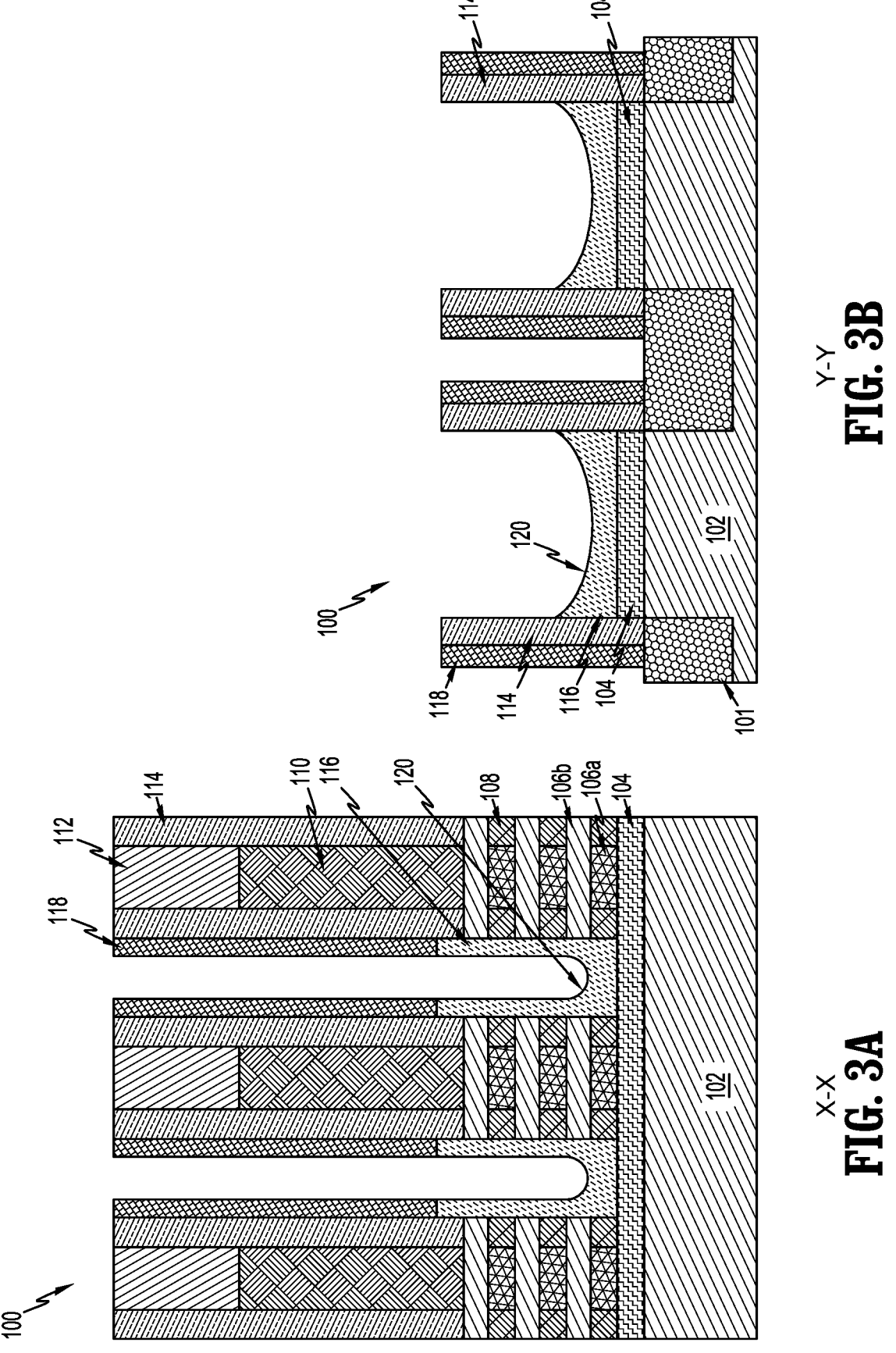
FIG. 3A is a cross-sectional view illustrating the semiconductor structure taken along the X-X axis of FIG. 1A at a third-intermediate fabrication stage, according to an illustrative embodiment.
FIG. 3B is a cross-sectional view of the semiconductor structure taken along the Y-Y axis of FIG. 1A at the third-intermediate fabrication stage, according to an illustrative embodiment.

FIGS. 3A and 3B illustrate semiconductor structure 100 at a third-intermediate fabrication stage. During this stage, source/drain region 116 is recessed by conventional techniques to form a top surface having a recessed inner portion 120. Suitable etching processes include, for example, a dry etch process such as plasma etching or reactive ion etching (RIE), or a wet etching can be used. In one embodiment, the recessed inner portion 120 of the top surface of the source/drain region 116 has a u-shape. In one embodiment, the recessed inner portion 120 of the top surface of the source/drain region 116 has a v-shape. In one embodiment, the recessed inner portion 120 of the top surface of the source/drain region 116 has a semi-circular shape.

Figures 4A, 4B:
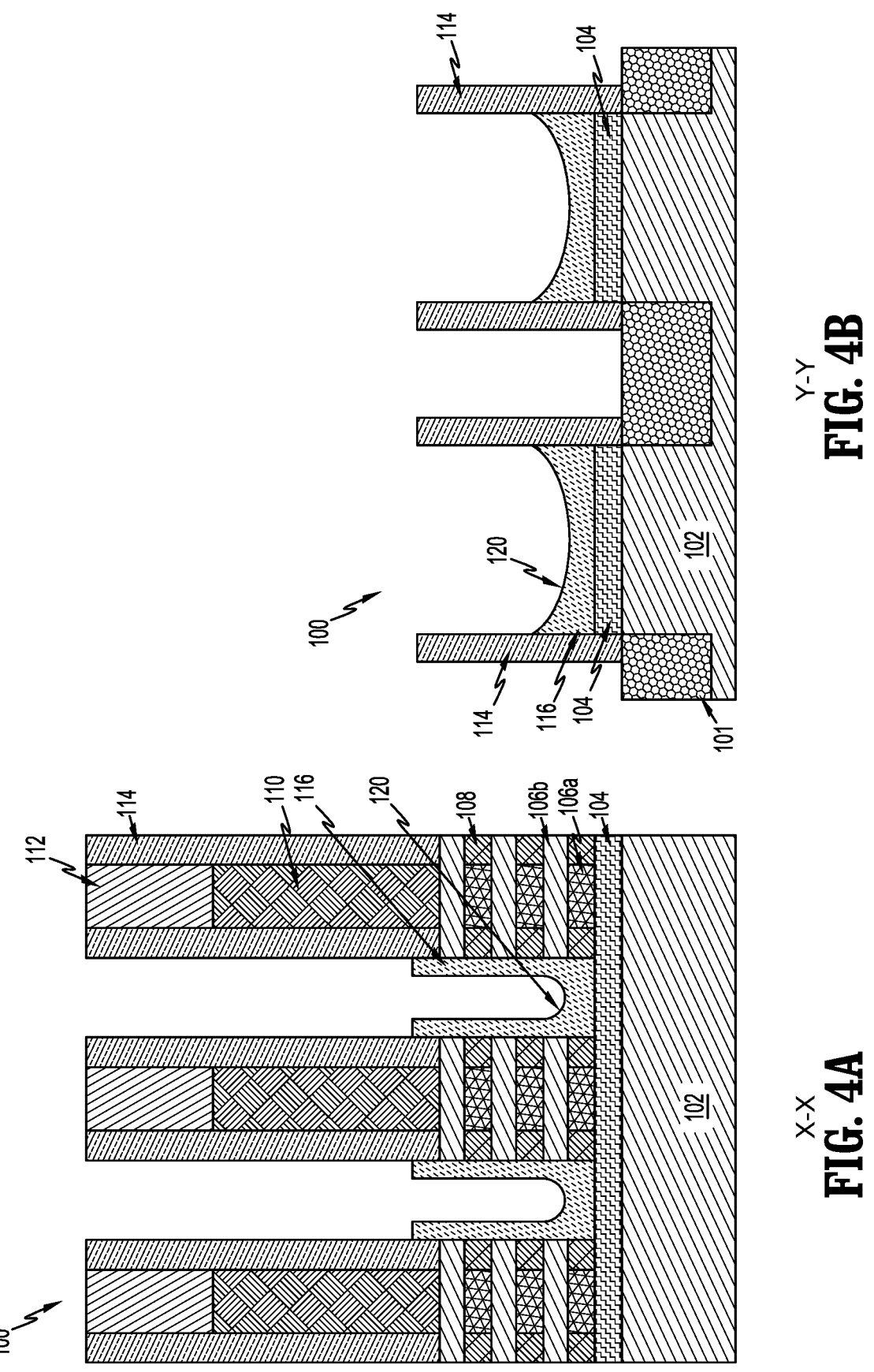
FIG. 4A is a cross-sectional view illustrating the semiconductor structure taken along the X-X axis of FIG. 1A at a fourth-intermediate fabrication stage, according to an illustrative embodiment.
FIG. 4B is a cross-sectional view of the semiconductor structure taken along the Y-Y axis of FIG. 1A at the fourth-intermediate fabrication stage, according to an illustrative embodiment.

FIGS. 4A and 4B illustrate semiconductor structure 100 at a fourth-intermediate fabrication stage. During this stage, sacrificial liner layer 118 is removed by, for example, one or more suitable wet or dry etching processes.

Figures 5A, 5B:
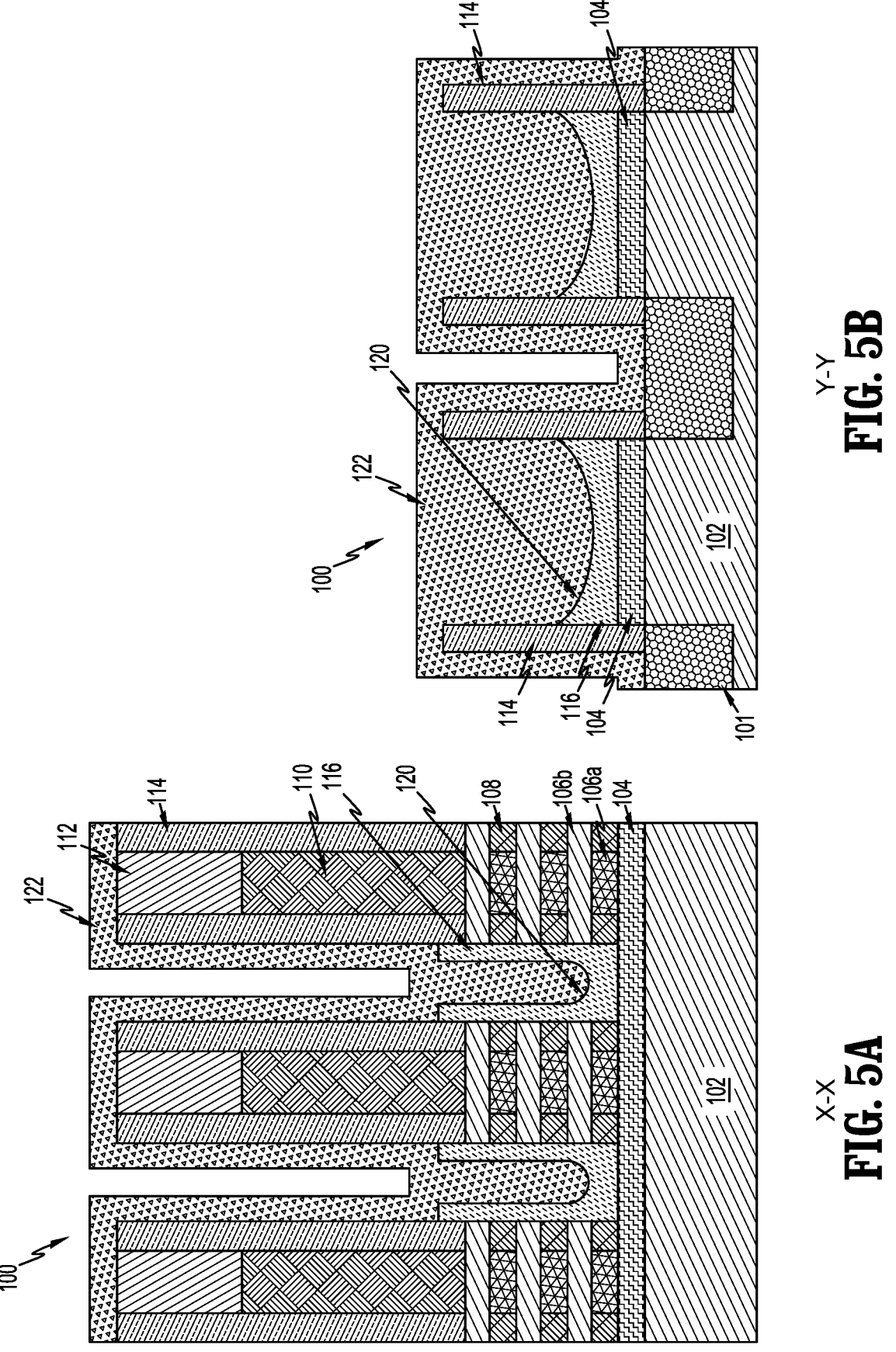
FIG. 5A is a cross-sectional view illustrating the semiconductor structure taken along the X-X axis of FIG. 1A at a fifth-intermediate fabrication stage, according to an illustrative embodiment.
FIG. 5B is a cross-sectional view of the semiconductor structure taken along the Y-Y axis of FIG. 1A at the fifth-intermediate fabrication stage, according to an illustrative embodiment.

FIGS. 5A and 5B illustrate semiconductor structure 100 at a fifth-intermediate fabrication stage. During this stage, a sacrificial material 122 is deposited on the recessed source/drain region 116 and on the exterior surfaces of sidewall spacer 114 and gate hardmask 112 to pinch-off the recessed source/drain region 116 as depicted in FIG. 5A. In addition, sacrificial material 122 is also deposited on the recessed source/drain region 116 and on the exterior surfaces of sidewall spacer 114 and STI region 101 as depicted in FIG. 5B. Sacrificial material 122 can be deposited by any of a variety of different known techniques, e.g., an atomic layer deposition (ALD) process. Sacrificial material 122 can be comprised of a variety of different materials, e.g., amorphous silicon, polysilicon, TiOx, AlOx, etc.

Figures 6A, 6B:
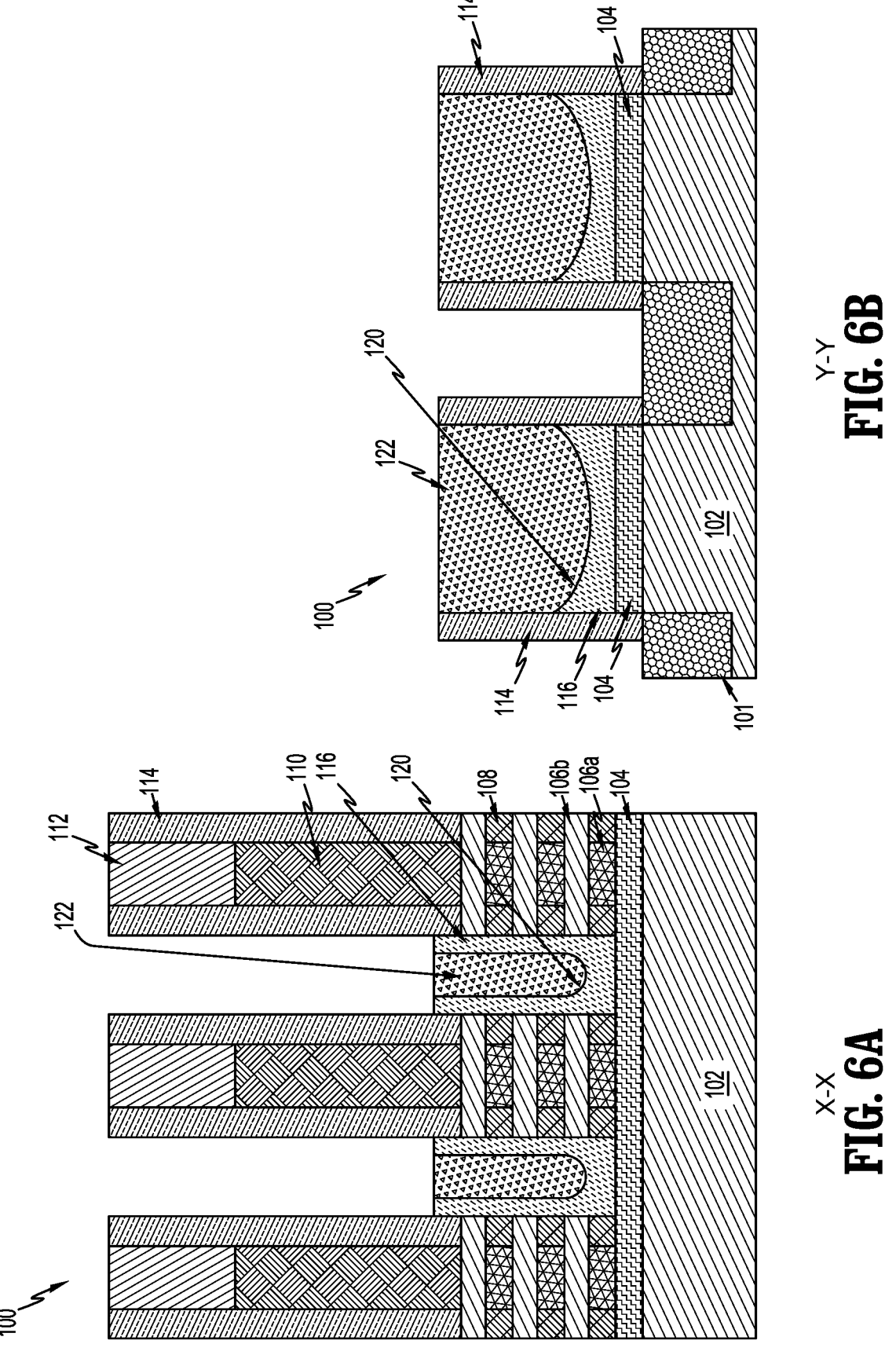
FIG. 6A is a cross-sectional view illustrating the semiconductor structure taken along the X-X axis of FIG. 1A at a sixth-intermediate fabrication stage, according to an illustrative embodiment.
FIG. 6B is a cross-sectional view of the semiconductor structure taken along the Y-Y axis of FIG. 1A at the sixth-intermediate fabrication stage, according to an illustrative embodiment.

FIGS. 6A and 6B illustrate semiconductor structure 100 at a sixth-intermediate fabrication stage. During this stage, a portion of sacrificial material 122 is removed from sidewall spacer 114 and is coplanar with the top surface of recessed source/drain region 116 as depicted in FIG. 6A. In addition, a portion of sacrificial material 122 is removed from sidewall spacer 114 and the top of STI region 101, leaving sacrificial material 122 on the recessed source/drain region 116 and coplanar with the top surface of sidewall spacer 114 as depicted in FIG. 6B. The portion of sacrificial material 122 can be removed by one or more isotropic wet or dry etching processes.

Figures 7A, 7B:
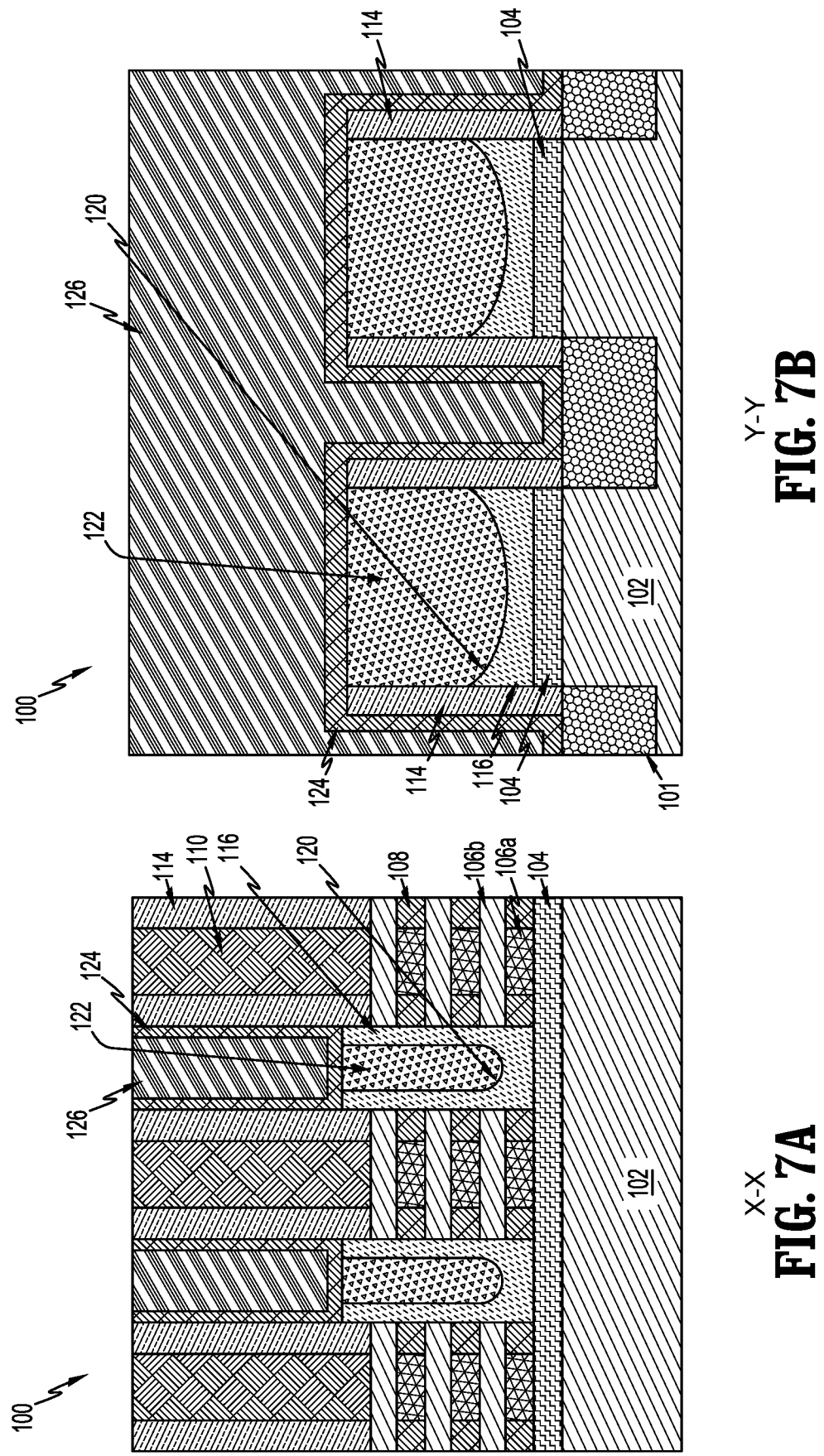
FIG. 7A is a cross-sectional view illustrating the semiconductor structure taken along the X-X axis of FIG. 1A at a seventh-intermediate fabrication stage, according to an illustrative embodiment.
FIG. 7B is a cross-sectional view of the semiconductor structure taken along the Y-Y axis of FIG. 1A at the seventh-intermediate fabrication stage, according to an illustrative embodiment.

FIGS. 7A and 7B illustrate semiconductor structure 100 at a seventh-intermediate fabrication stage. During this stage, an etch stop liner layer 124 is formed (e.g., deposited by ALD, CVD, etc.) on sacrificial material 122, recessed source/drain region 116 and sidewall spacer 114 as depicted in FIG. 7A. In addition, the etch stop liner layer 124 is also formed on sacrificial material 122, sidewall spacer 114 and STI region 101 as depicted in FIG. 7B. The etch stop liner layer 124 may be, for example, silicon nitride or other nitride based material.

An interlayer dielectric (ILD) layer 126 is then deposited on etch stop liner layer 124. The ILD layer 126 includes, for example, any suitable dielectric material such as silicon oxide, silicon nitride, hydrogenated silicon carbon oxide, silicon based low-k dielectrics, flowable oxides, porous dielectrics, or organic dielectrics including porous organic dielectrics. Non-limiting examples of suitable low-k dielectric materials include a spin-on-glass, a flowable oxide, a high-density plasma oxide, borophosphosilicate glass (BPSG), or any combination thereof. The ILD layer 126 may be formed using any suitable deposition techniques including CVD, ALD, PVD, PECVD, chemical solution deposition or other like processes. ILD layer 126 can be planarized by, for example, a planarization process such as CMP. The gate hardmask 112 is removed during the CMP process, and a top surface of the dummy gate 110 is exposed.

Figures 8A, 8B:
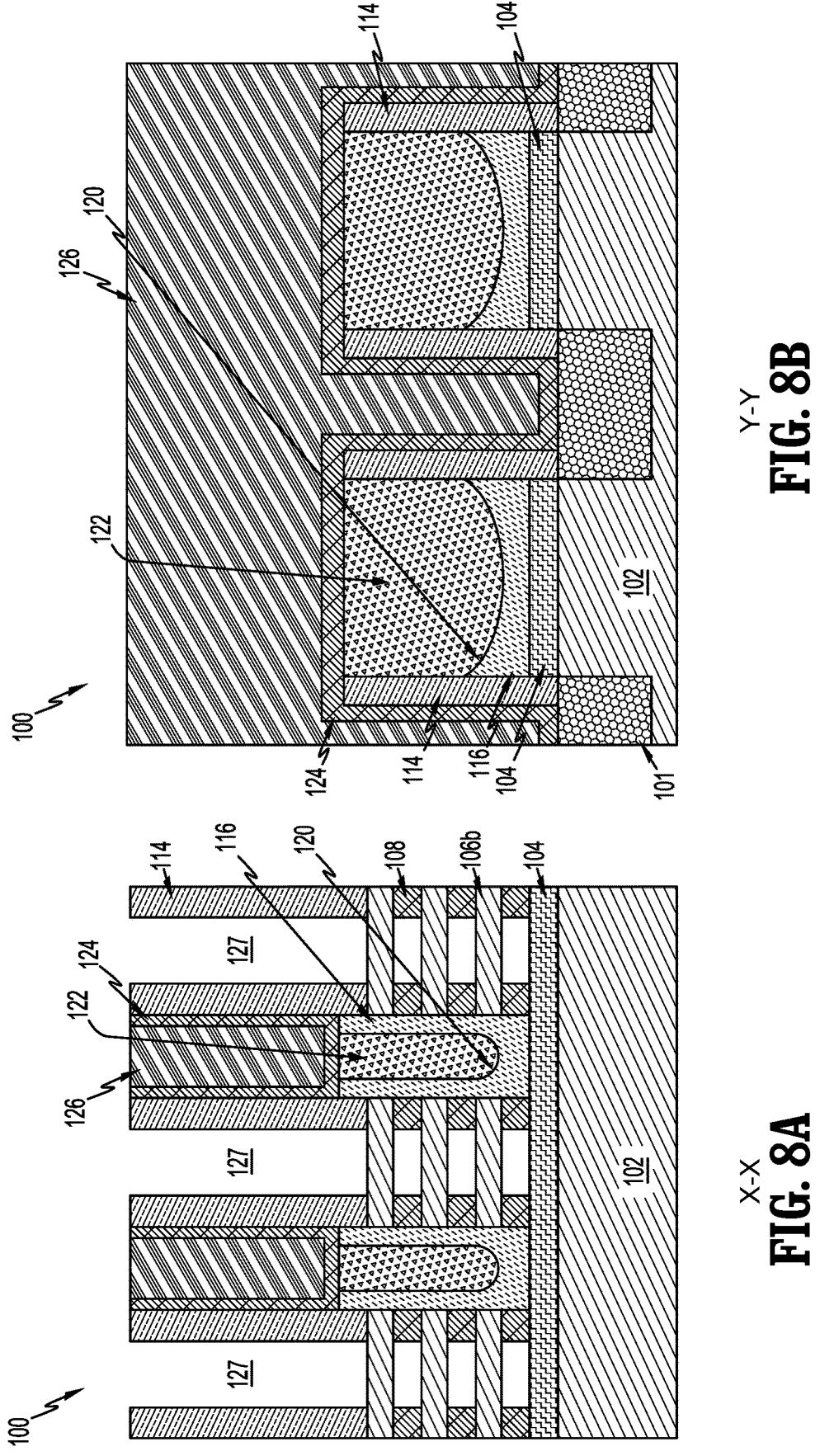
FIG. 8A is a cross-sectional view illustrating the semiconductor structure taken along the X-X axis of FIG. 1A at an eighth-intermediate fabrication stage, according to an illustrative embodiment.
FIG. 8B is a cross-sectional view of the semiconductor structure taken along the Y-Y axis of FIG. 1A at the eighth-intermediate fabrication stage, according to an illustrative embodiment.

FIGS. 8A and 8B illustrate semiconductor structure 100 at an eighth-intermediate fabrication stage. During this stage, FIG. 8A depicts the semiconductor structure 100 after one or more wet or dry etching processes were performed to remove the dummy gate 110 and sacrificial layers 106a to thereby define a gate cavity 127 where a replacement gate structure will subsequently be formed for the semiconductor structure 100.

Figures 9A, 9B:
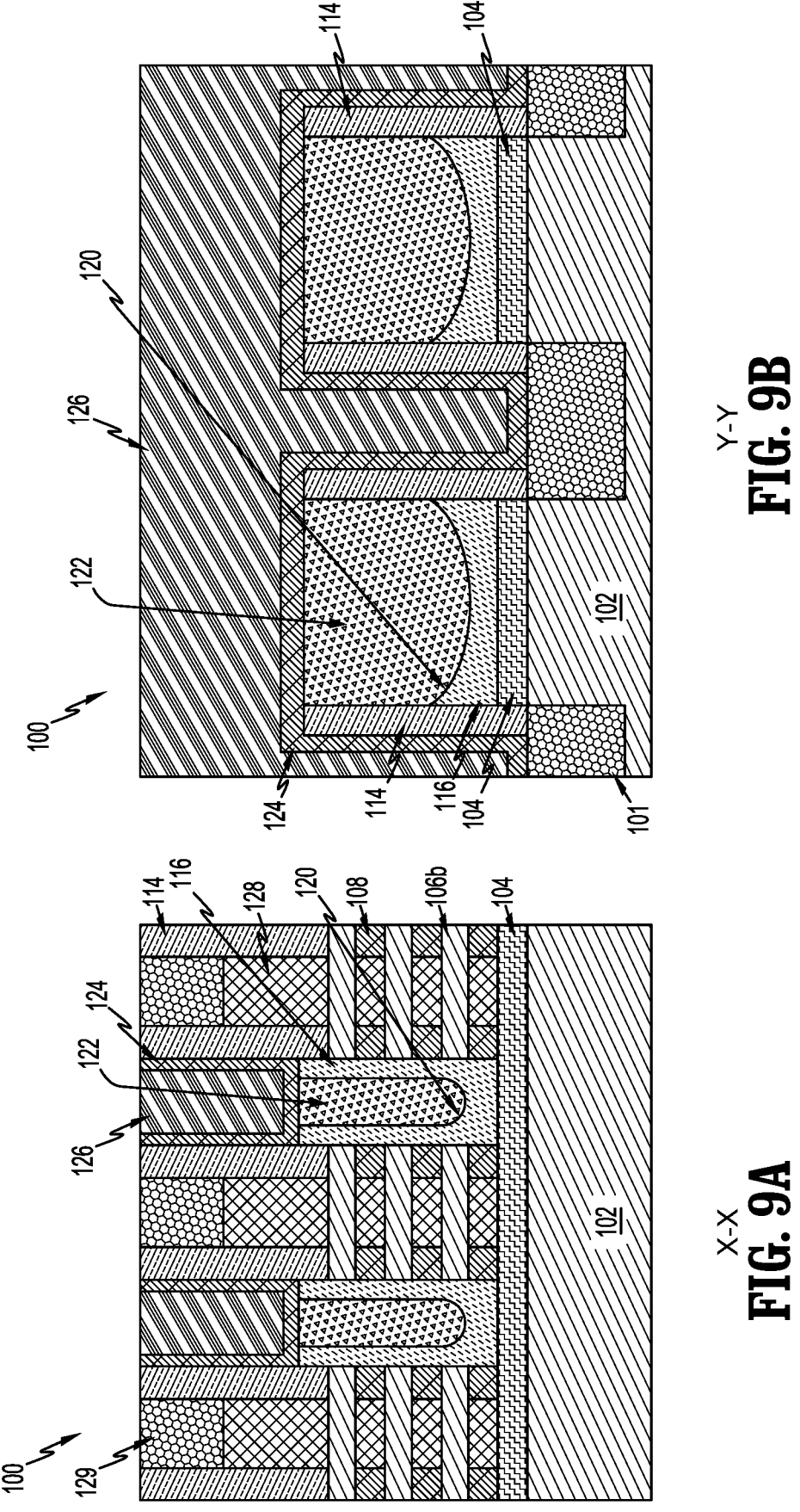
FIG. 9A is a cross-sectional view illustrating the semiconductor structure taken along the X-X axis of FIG. 1A at a ninth-intermediate fabrication stage, according to an illustrative embodiment.
FIG. 9B is a cross-sectional view of the semiconductor structure taken along the Y-Y axis of FIG. 1A at the ninth-intermediate fabrication stage, according to an illustrative embodiment.

FIGS. 9A and 9B illustrate semiconductor structure 100 at a ninth-intermediate fabrication stage. During this stage, replacement gate structure 128 is formed in the gate cavity 127. The replacement gate structure depicted herein is intended to be representative in nature of any type of gate structure that may be employed in manufacturing integrated circuit products using so-called gate-last (replacement gate) manufacturing techniques. The replacement gate structure typically comprises a high-k (e.g., a k value greater than 5 or greater than 10) gate insulation layer (not individually shown), such as hafnium oxide, one or more metal layers (not individually shown) (e.g., layers of titanium nitride or TiAlC depending upon the type of transistor device being manufactured), and a bulk conductive material layer (not individually shown), such as tungsten or aluminum.

Next, the replacement gate structure 128 is recessed, and a self-aligned contact ("SAC") cap material 129 may be deposited on the replacement gate structure 128 and sidewall spacer 114. The SAC cap material 129 may be, for example, a nitride material, such as silicon nitride (SiN), or another insulating material. Planarization, for example, CMP, may be performed to the device to remove the excess SAC cap material 129 as shown in FIG. 9A. The terms "SAC cap" and "self-aligned contact cap" may be used interchangeably herein to refer to the protective material over the replacement gate structure 128.

Figures 10A, 10B:
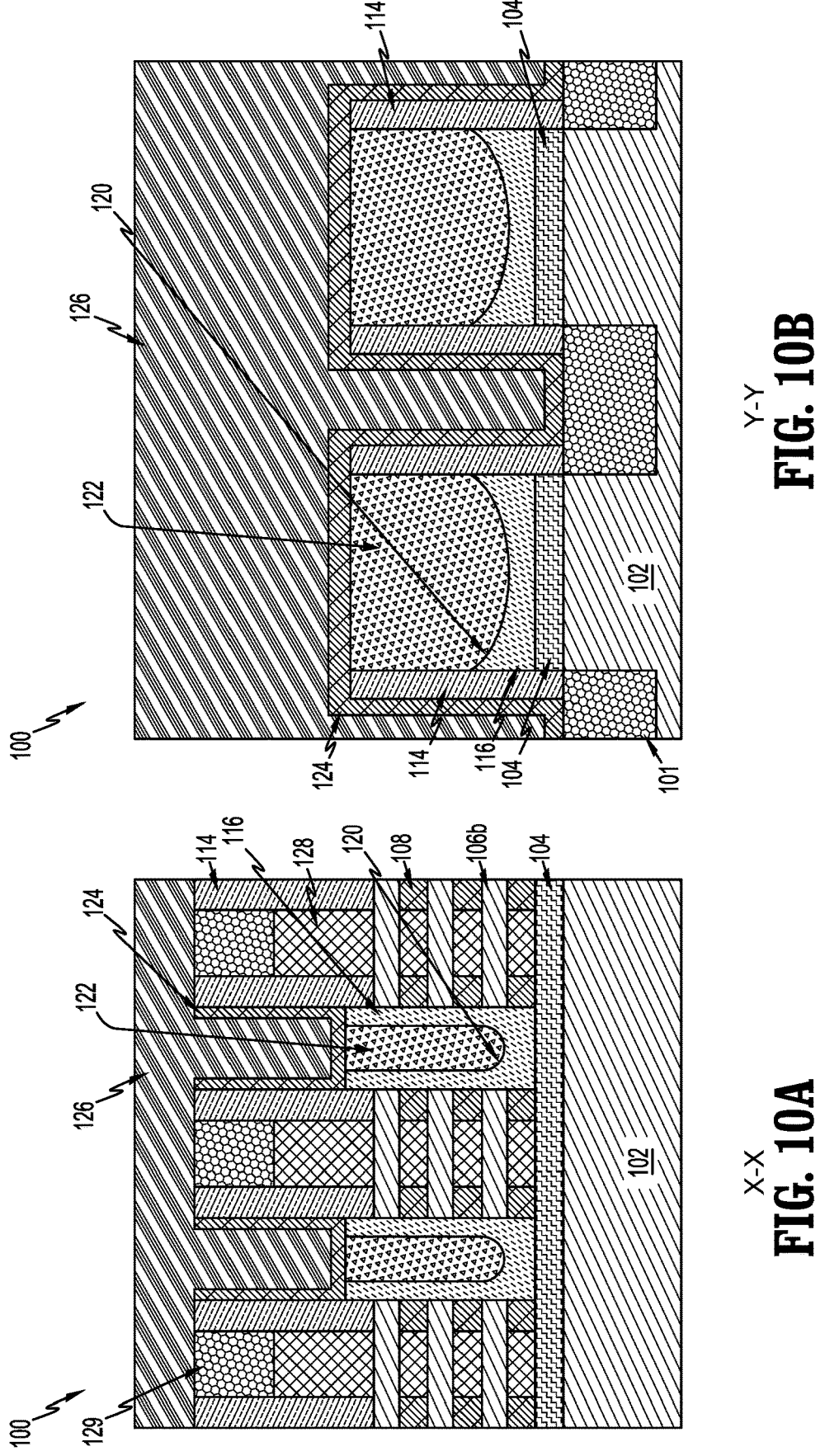
FIG. 10A is a cross-sectional view illustrating the semiconductor structure taken along the X-X axis of FIG. 1A at a tenth-intermediate fabrication stage, according to an illustrative embodiment.
FIG. 10B is a cross-sectional view of the semiconductor structure taken along the Y-Y axis of FIG. 1A at the tenth-intermediate fabrication stage, according to an illustrative embodiment.

FIGS. 10A and 10B illustrate semiconductor structure 100 at a tenth-intermediate fabrication stage. During this stage, an additional ILD layer 126 is deposited on ILD layer 126 as well as sidewall spacer 114 and SAC cap layer 129 using the techniques discussed above.

Figures 11A, 11B:
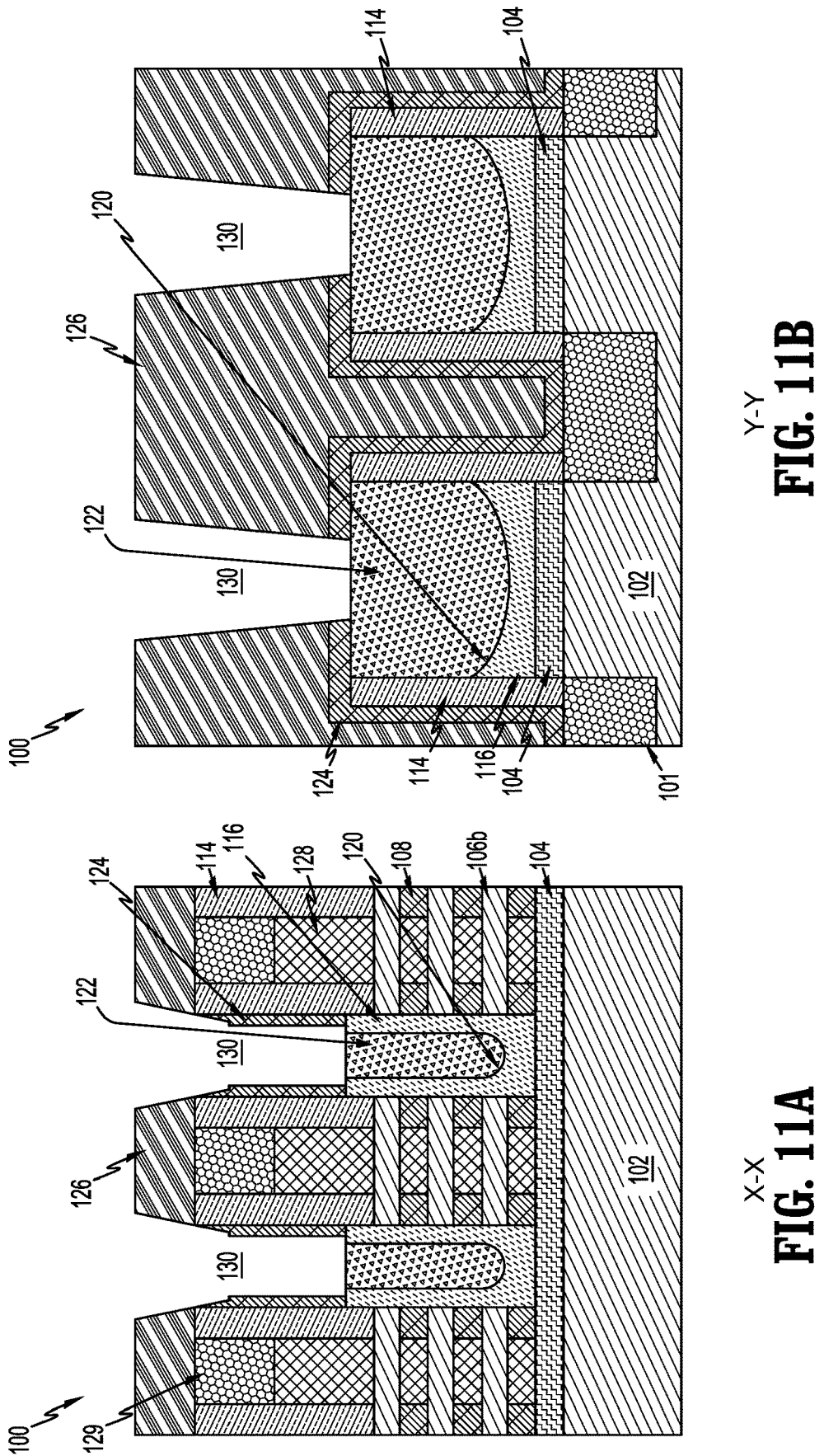
FIG. 11A is a cross-sectional view illustrating the semiconductor structure taken along the X-X axis of FIG. 1A at an eleventh-intermediate fabrication stage, according to an illustrative embodiment.
FIG. 11B is a cross-sectional view of the semiconductor structure taken along the Y-Y axis of FIG. 1A at the eleventh-intermediate fabrication stage, according to an illustrative embodiment.

FIGS. 11A and 11B illustrate semiconductor structure 100 at an eleventh-intermediate fabrication stage. During this stage, source/drain contact regions 130 are formed by, conventional lithographic and etching processes in ILD layer 126 above a top surface of etch stop liner layer 124. One or more selective dry or wet etching processes are then performed to remove the etch stop liner layer 124 exposing a top surface of sacrificial material 122. As depicted in FIG. 11B, a portion of the top surface of sacrificial material 122 remains unexposed under etch stop liner layer 124 and ILD layer 126.

Figures 12A, 12B:
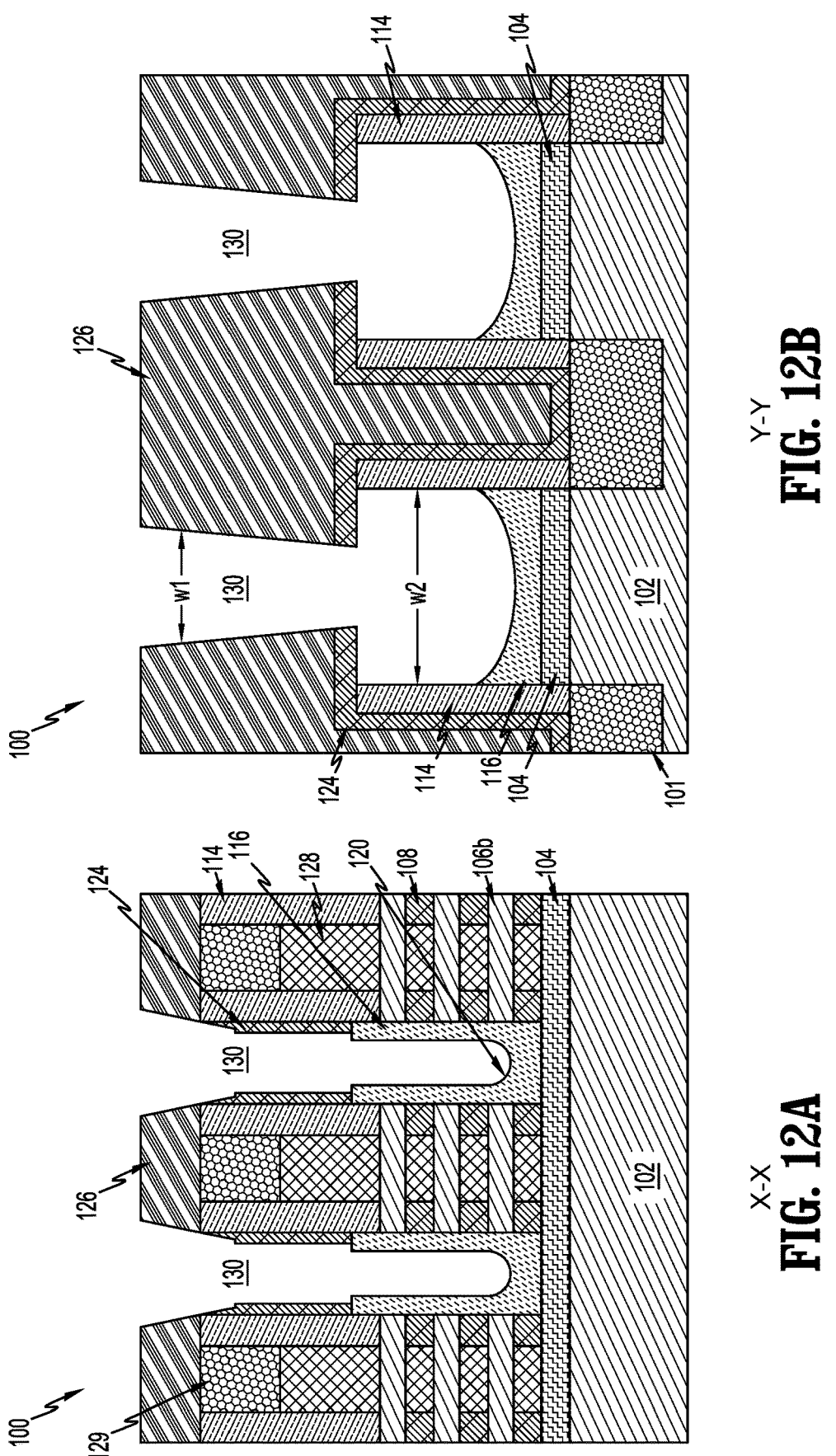
FIG. 12A is a cross-sectional view illustrating the semiconductor structure taken along the X-X axis of FIG. 1A at a twelfth-intermediate fabrication stage, according to an illustrative embodiment.
FIG. 12B is a cross-sectional view of the semiconductor structure taken along the Y-Y axis of FIG. 1A at the twelfth-intermediate fabrication stage, according to an illustrative embodiment.

FIGS. 12A and 12B illustrate semiconductor structure 100 at a twelfth-intermediate fabrication stage. During this stage, the sacrificial material 122 is removed to further extend source/drain contact regions 130 using a selective etch such as an isotropic etch to expose the exterior surface of recessed source/drain region 116. In an illustrative embodiment, a width of a top portion of source/drain contact regions 130 denoted as w1, is less than a width of a bottom portion of source/drain contact regions 130 denoted as w2. In an illustrative embodiment, a width (w1) of a portion of source/drain contact region 130 above a top surface of etch stop liner layer 124 is less than a width (w2) of a portion of source/drain contact region 130 below a bottom surface of etch stop liner layer 124 and extending down to the recessed source/drain region 116.

Figures 13A, 13B:
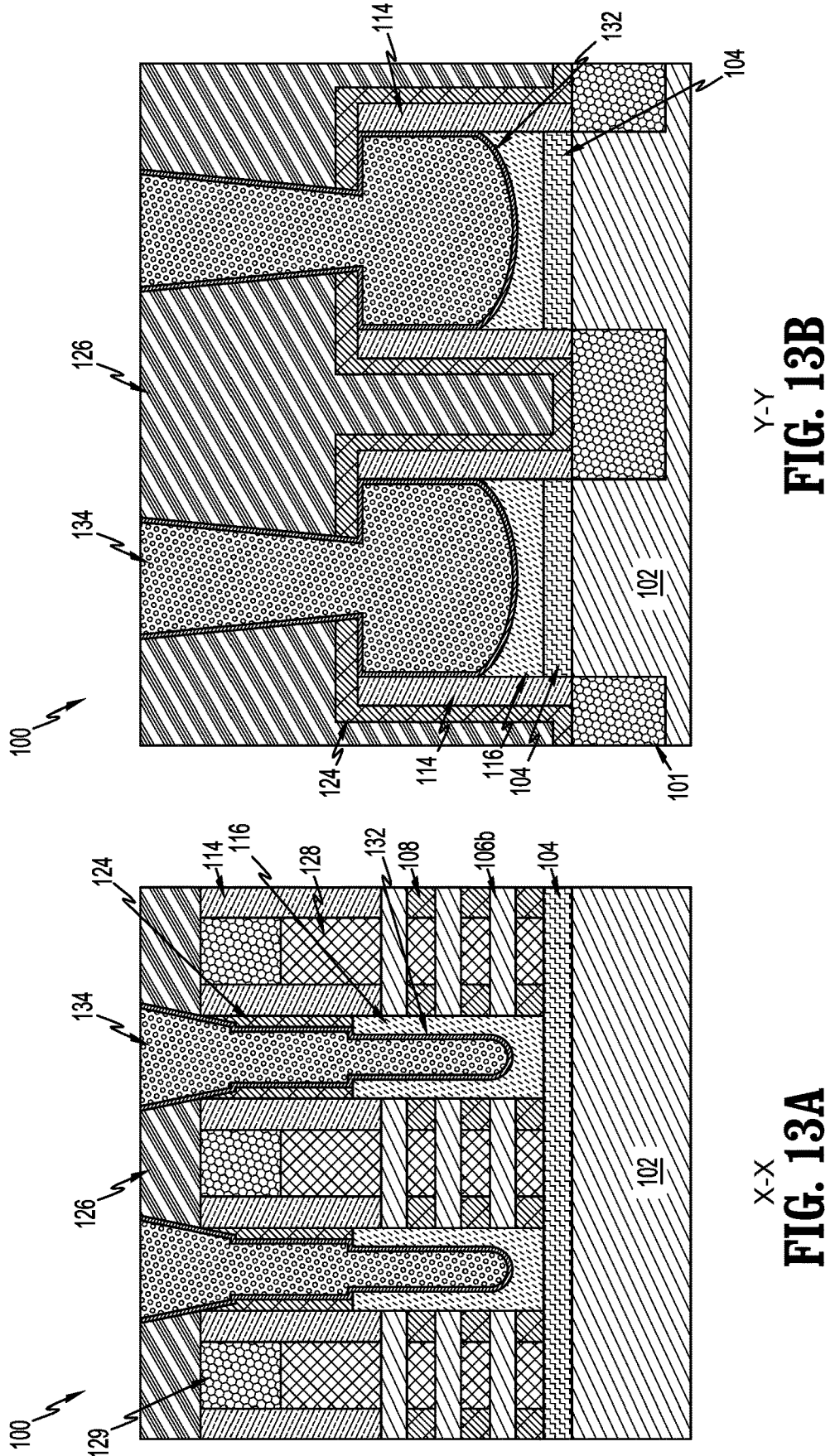
FIG. 13A is a cross-sectional view illustrating the semiconductor structure taken along the X-X axis of FIG. 1A at a thirteenth-intermediate fabrication stage, according to an illustrative embodiment.
FIG. 13B is a cross-sectional view of the semiconductor structure taken along the Y-Y axis of FIG. 1A at the thirteenth-intermediate fabrication stage, according to an illustrative embodiment.

FIGS. 13A and 13B illustrate semiconductor structure 100 at a thirteenth-intermediate fabrication stage. During this stage, a metal-containing liner (i.e., metal/metal-silicide layer) 132 is formed on the exposed surfaces of recessed source/drain region 116, etch stop liner layer 124 and ILD layer 126 in source/drain contact regions 130. The metal-containing liner 132 can be formed by depositing a layer of suitable metal material, e.g., titanium, that is pre-determined or desired to form a silicide on recessed source/drain region 116; subsequently subjecting the metal layer to an environment of suitable temperature to cause reaction of the metal material with underneath silicon thereby forming a silicide. The remaining portion of metal on etch stop liner layer 124 and ILD layer 126 will form a metal-containing liner 132 in source/drain contact regions 130. The liner 132 may further comprise a thin metal adhesion layer, such as, for example, TiN.

Next, a high conductance metal 134 is deposited in source/drain contact regions 130 and on metal-containing liner 132. Suitable metals for high conductance metal 134 include conductive material such as, for example, tungsten (W), aluminum (Al), copper (Cu), cobalt (Co), ruthenium (Ru), molybdenum (Mo), or any other suitable conductive material. In various embodiments, the high conductance metal 134 can be formed by ALD, CVD, PVD, and/or plating. The high conductance metal 134 can be planarized using, for example, a planarizing process such as CMP. Other planarization processes can include grinding and polishing.

Figures 14A, 14B, 14C:
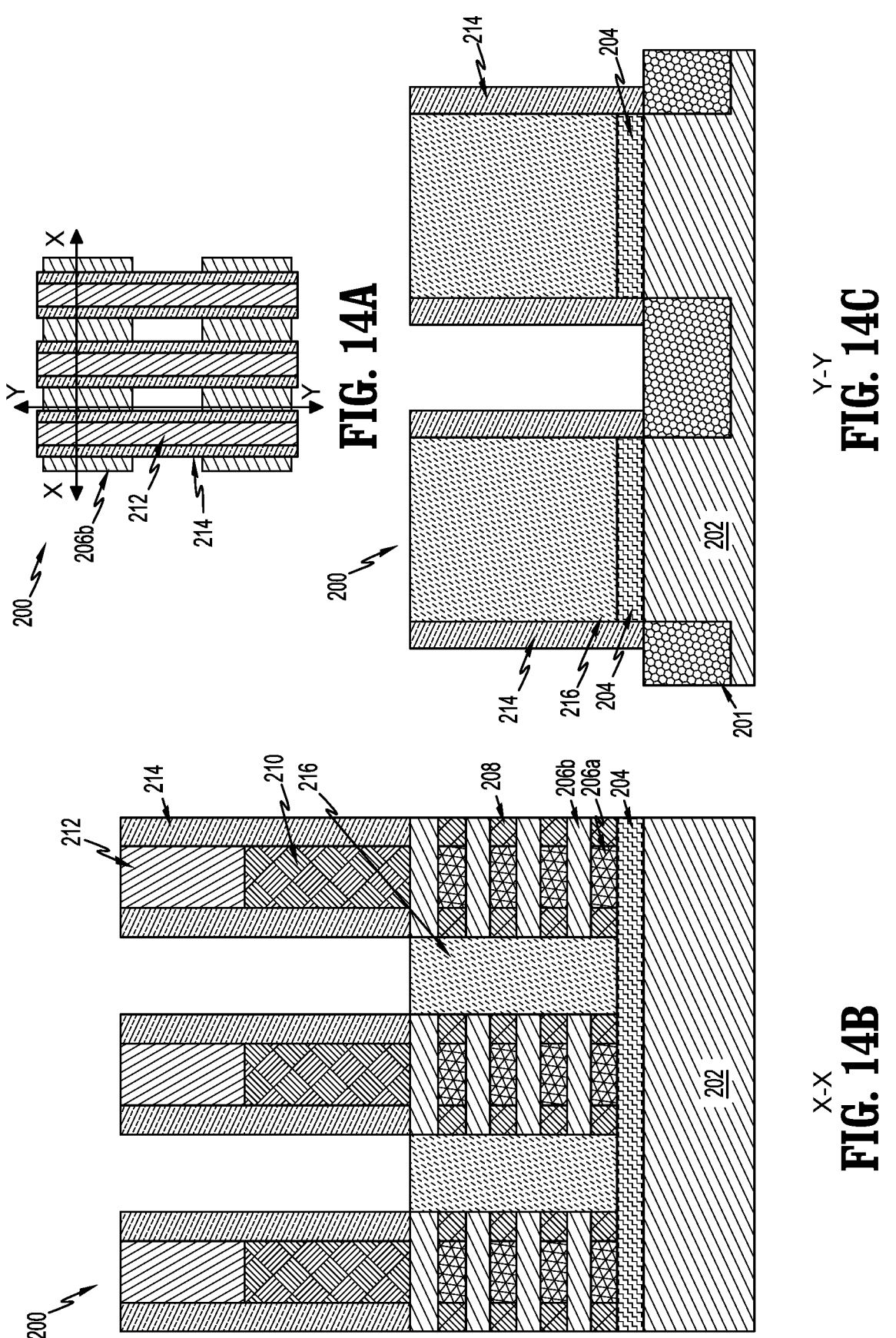
FIG. 14A is a top view illustrating the semiconductor structure at a first-intermediate fabrication stage, according to an illustrative alternative embodiment.
FIG. 14B is a cross-sectional view illustrating the semiconductor structure taken along the X-X axis of FIG. 14A at the first-intermediate fabrication stage, according to an illustrative alternative embodiment.
FIG. 14C is a cross-sectional view of the semiconductor structure taken along the Y-Y axis of FIG. 14A at the first-intermediate fabrication stage, according to an illustrative embodiment.

FIGS. 14A-28D illustrate an alternate embodiment starting with the semiconductor structure 200. FIGS. 14A-14C illustrate semiconductor structure 200 at a first-intermediate fabrication stage. FIGS. 14A-14C shows a semiconductor structure 200 with substrate 202. In general, substrate 202 can be composed of any currently known or later developed semiconductor material as discussed above for substrate 102. A STI region 201 can be formed in substrate 202 (FIG. 14C). STI region 201 comprises any material as discussed above for STI region 101.

Semiconductor structure 200 further includes alternating sacrificial layers 206a and channel layers 206b formed on BDI layer 204. Although four alternating nanosheet layers of sacrificial layers 206a and channel layers 206b are shown, this number is not limiting and any number of alternating layers can be used herein. BDI layer 204 can be formed in a similar manner and of a similar material as discussed above for BDI layer 104. Sacrificial layers 206a and channel layers 206b can be formed in a similar manner and be of a similar material as discussed above for sacrificial layers 106a and channel layers 106b. Sacrificial layers 206a are disposed between inner spacers 208. Inner spacers 208 can be any material as discussed above for inner spacers 108.

Semiconductor structure 200 further includes dummy gate 210 on the top most channel layer 206b. Dummy gate 210 can be of a similar material as discussed above for dummy gate 110. The dummy gate material can then be subjected to a planarizing process such as a CMP operation. A thin dummy gate oxide layer (not shown) can be disposed between the dummy gate and nanosheet stack.

Semiconductor structure 200 further includes gate hardmask 212 on dummy gate 210 and sidewall spacer 214 disposed on the exterior sidewall surfaces of dummy gate 210 and gate hardmask 212. Suitable material for gate hardmask 212 and sidewall spacer 214 can any material as discussed above for gate hardmask 112 and sidewall spacer 114, respectively.

Semiconductor structure 200 further includes source/drain region 216 on BDI layer 204. For example, source/drain region 216 is formed on BDI layer 204, around the sidewalls of sacrificial layers 206a and channel layers 206b, inner spacers 208 and on a portion of sidewall spacer 214. The source/drain region 216 can be formed by a similar process and in-situ doped in a similar manner as discussed above for source/drain region 116.

Figures 15A, 15B:
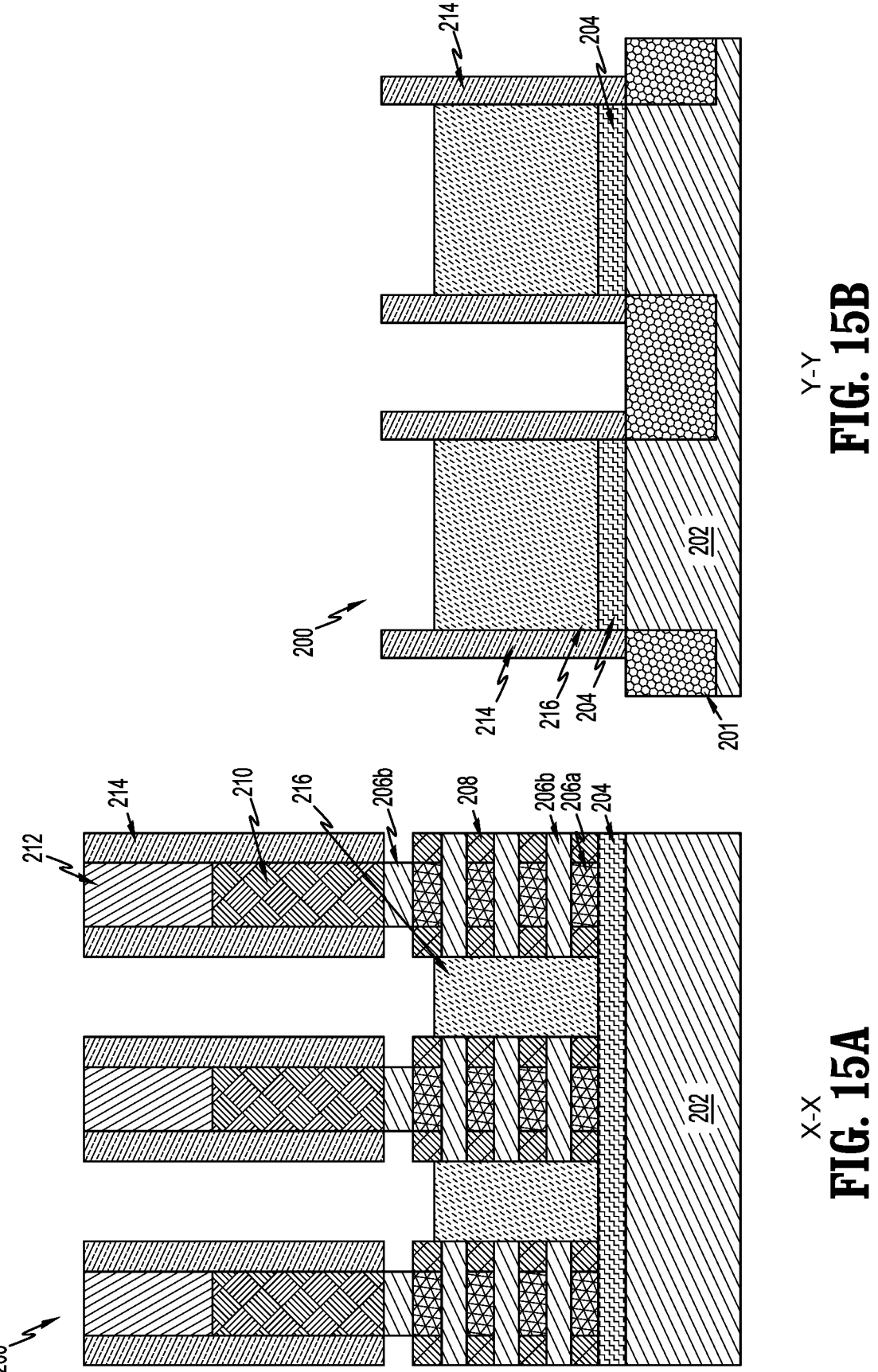
FIG. 15A is a cross-sectional view illustrating the semiconductor structure taken along the X-X axis of FIG. 14A at a second-intermediate fabrication stage, according to an illustrative alternative embodiment.
FIG. 15B is a cross-sectional view of the semiconductor structure taken along the Y-Y axis of FIG. 14A at the second-intermediate fabrication stage, according to an illustrative alternative embodiment.

FIGS. 15A and 15B illustrate semiconductor structure 200 at a second-intermediate fabrication stage. During this stage, a top portion of source/drain region 216 is recessed, for example, to below the top most channel layer 206b of alternating nanosheets layers of sacrificial layers 206a and channel layers 206b. Source/drain region 216 can be recessed by conventional techniques such as isotropic dry etch process. During the isotropic etching process, outer portions of the top most channel layer 206b are recessed too, thereby creating a void such that the outer portion of top most channel layer 206b is aligned with the outer portion of each of the sacrificial layers 206a.

Figures 16A, 16B:
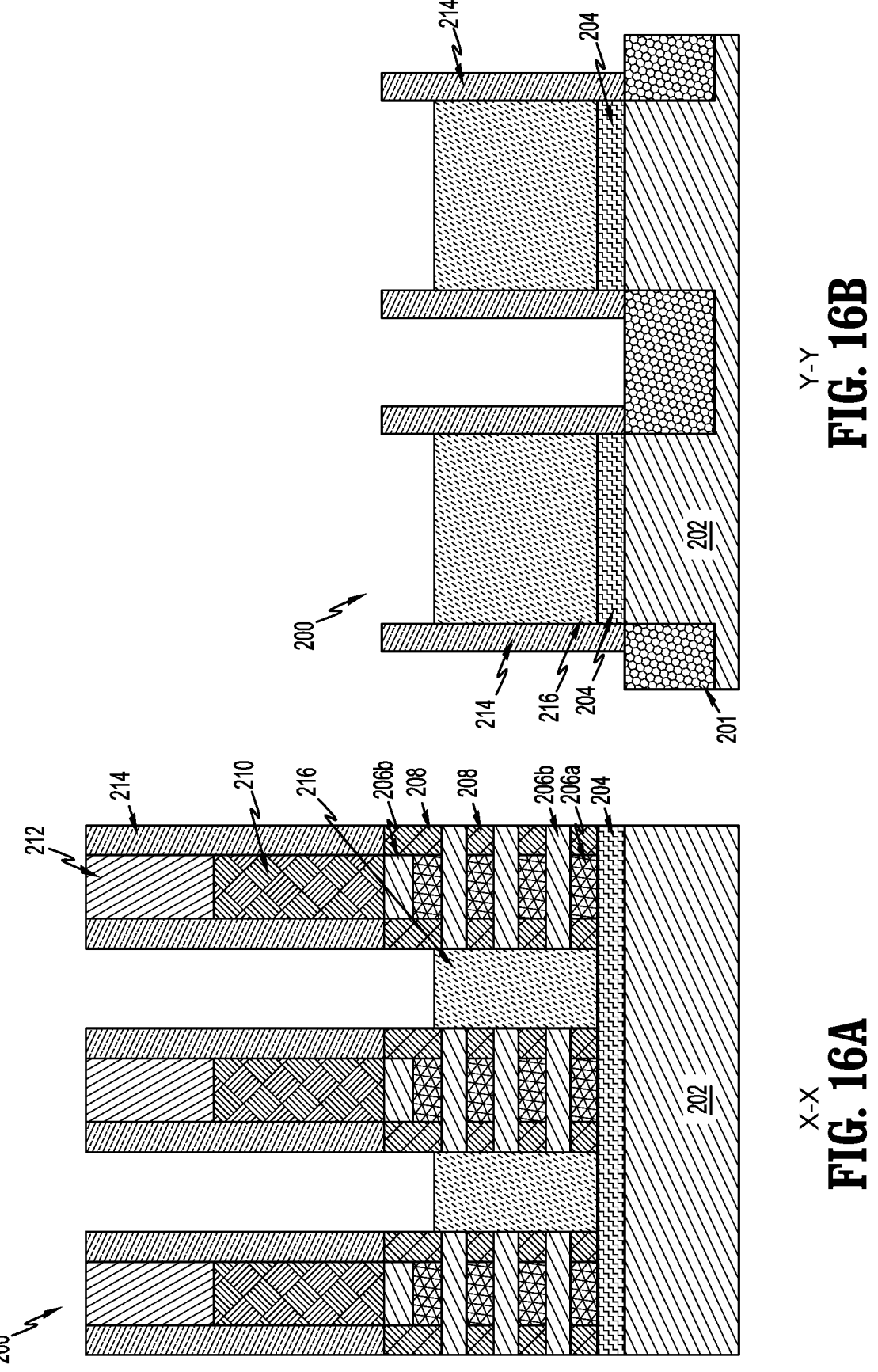
FIG. 16A is a cross-sectional view illustrating the semiconductor structure taken along the X-X axis of FIG. 14A at a third-intermediate fabrication stage, according to an illustrative alternative embodiment.
FIG. 16B is a cross-sectional view of the semiconductor structure taken along the Y-Y axis of FIG. 14A at the third-intermediate fabrication stage, according to an illustrative alternative embodiment.

FIGS. 16A and 16B illustrate semiconductor structure 200 at a third-intermediate fabrication stage. During this stage, inner spacers 208 are formed in the voids by conventional techniques such as ALD dielectric deposition followed by isotropic etch back, and can any material of those as discussed above for inner spacers 108.

Figures 17A, 17B:
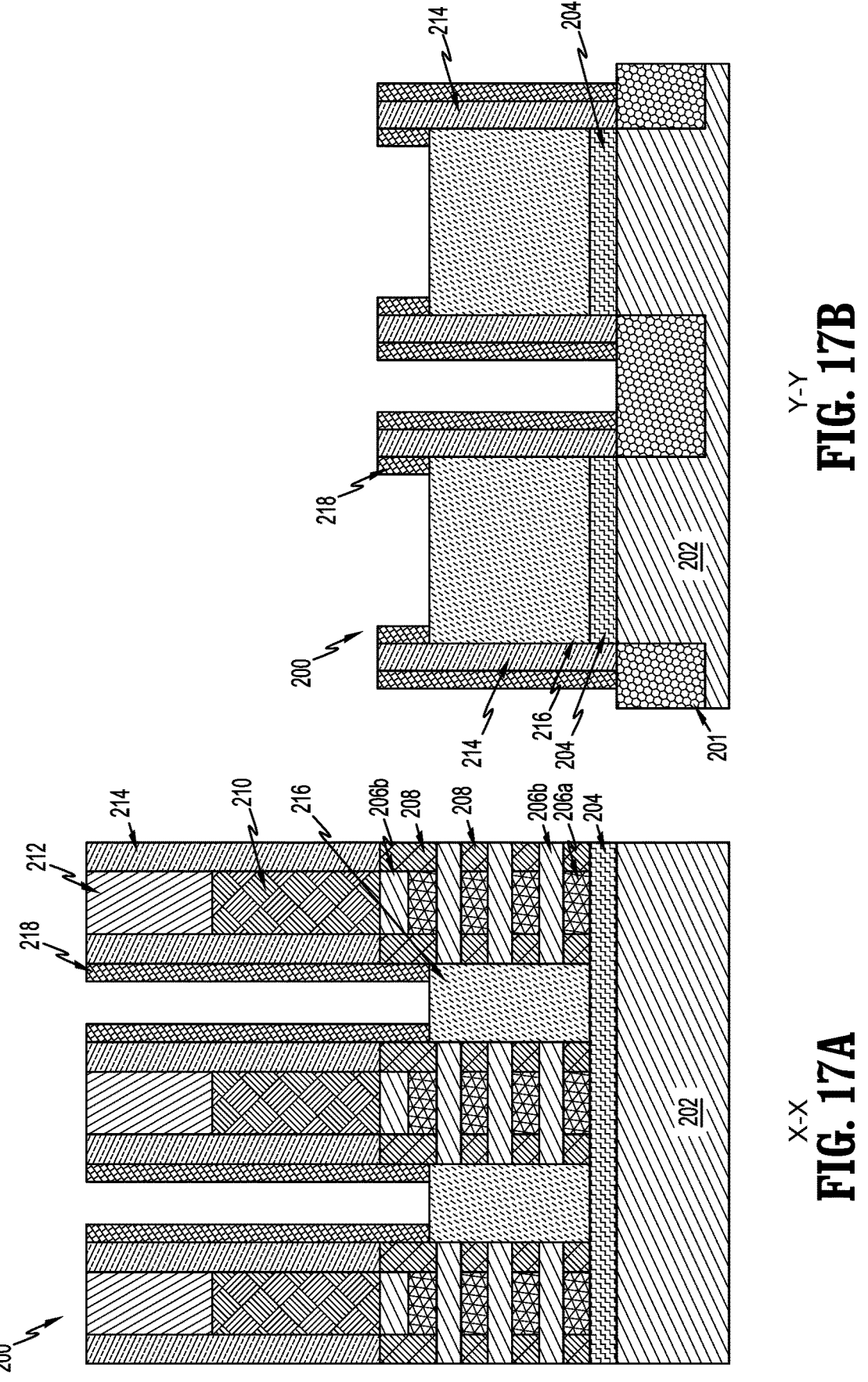
FIG. 17A is a cross-sectional view illustrating the semiconductor structure taken along the X-X axis of FIG. 14A at a fourth-intermediate fabrication stage, according to an illustrative alternative embodiment.
FIG. 17B is a cross-sectional view of the semiconductor structure taken along the Y-Y axis of FIG. 14A at the fourth-intermediate fabrication stage, according to an illustrative alternative embodiment.

FIGS. 17A and 17B illustrate semiconductor structure 200 at a fourth-intermediate fabrication stage. During this stage, sacrificial liner layer 218 is disposed on sidewall spacer 214 and on a portion of source/drain region 216 (FIG. 17A) and STI region 201 (FIG. 17B). Sacrificial liner layer 218 can be formed in a similar manner and be of a similar material as discussed above for sacrificial liner layer 118.

Figures 18A, 18B:
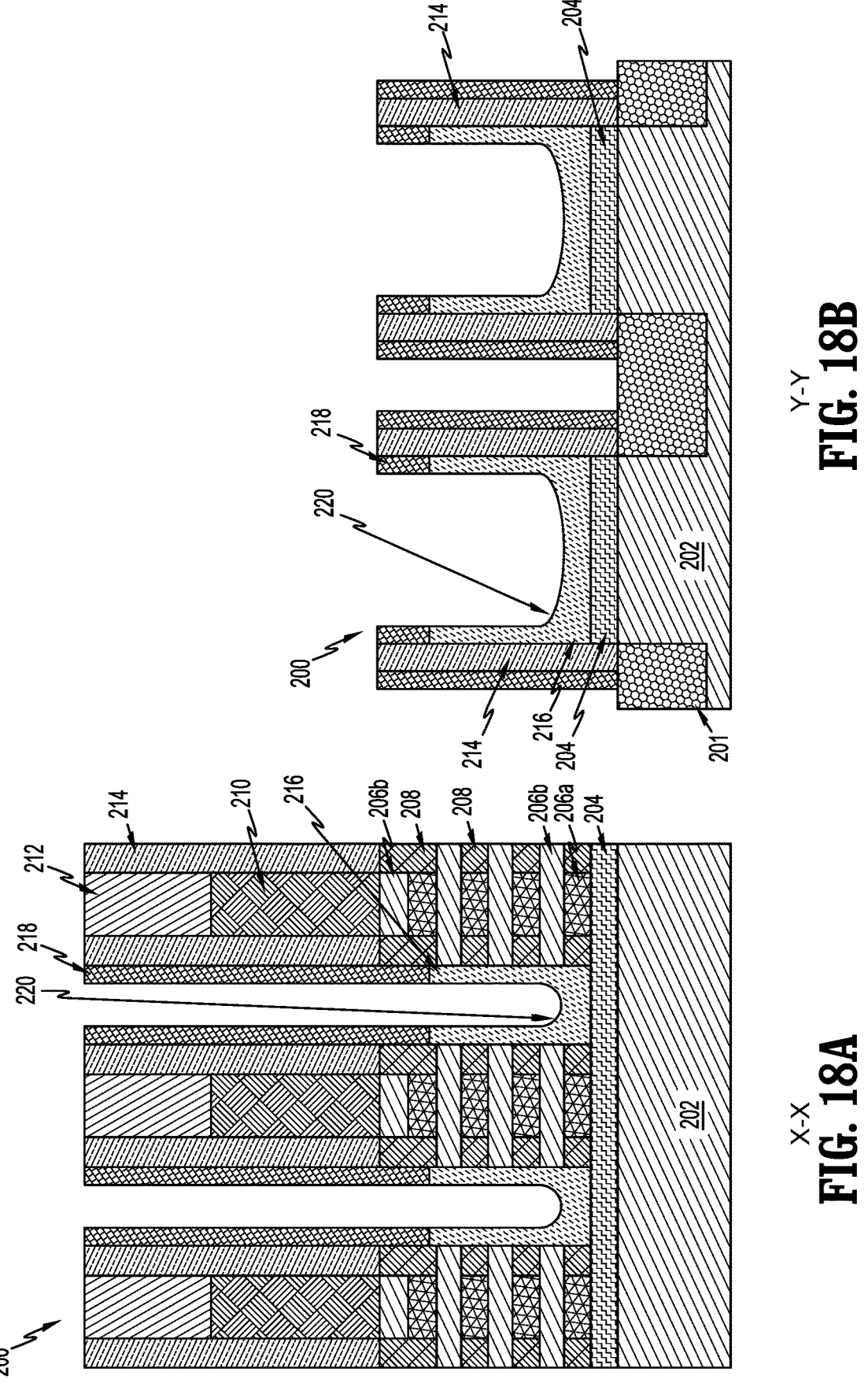
FIG. 18A is a cross-sectional view illustrating the semiconductor structure taken along the X-X axis of FIG. 14A at a fifth-intermediate fabrication stage, according to an illustrative alternative embodiment.
FIG. 18B is a cross-sectional view of the semiconductor structure taken along the Y-Y axis of FIG. 14A at the fifth-intermediate fabrication stage, according to an illustrative alternative embodiment.

FIGS. 18A and 18B illustrate semiconductor structure 200 at a fifth-intermediate fabrication stage. During this stage, source/drain region 216 is recessed by conventional techniques to form a top surface having a recessed inner portion 220. Suitable etching processes include those discussed above for source/drain region 116. In one embodiment, the recessed inner portion 220 of the top surface of the source/drain region 216 has a u-shape. In one embodiment, the recessed inner portion of the top surface of the source/drain region 216 has a v-shape. In one embodiment, the recessed inner portion 220 of the top surface of the source/drain region 216 has a semi-circular shape.

Figures 19A, 19B:
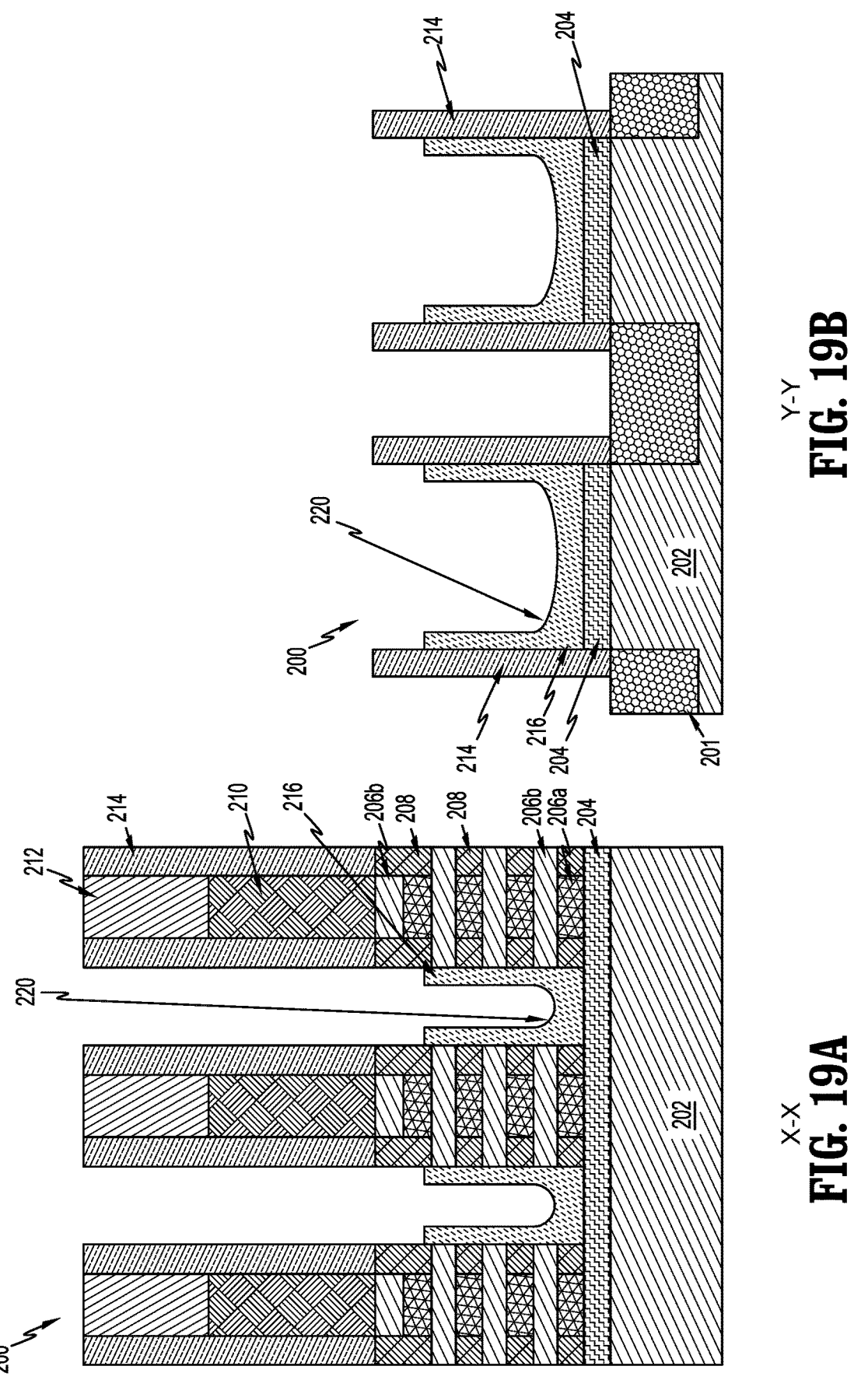
FIG. 19A is a cross-sectional view illustrating the semiconductor structure taken along the X-X axis of FIG. 14A at a sixth-intermediate fabrication stage, according to an illustrative alternative embodiment.
FIG. 19B is a cross-sectional view of the semiconductor structure taken along the Y-Y axis of FIG. 14A at the sixth-intermediate fabrication stage, according to an illustrative alternative embodiment.

FIGS. 19A and 19B illustrate semiconductor structure 200 at a sixth-intermediate fabrication stage. During this stage, sacrificial liner layer 218 is removed by, for example, one or more suitable wet or dry etching processes.

Figures 20A, 20B:
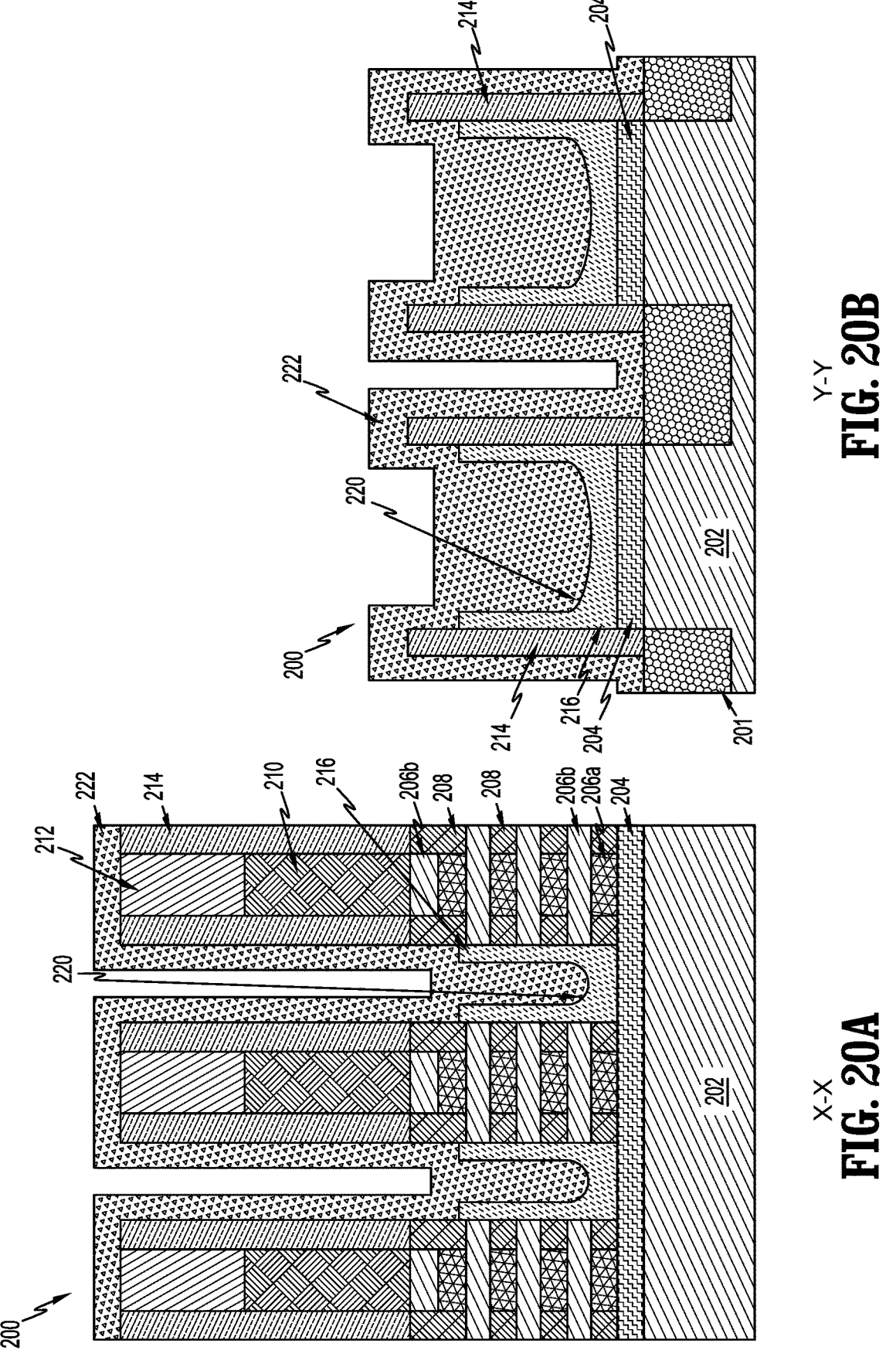
FIG. 20A is a cross-sectional view illustrating the semiconductor structure taken along the X-X axis of FIG. 14A at a seventh-intermediate fabrication stage, according to an illustrative alternative embodiment.
FIG. 20B is a cross-sectional view of the semiconductor structure taken along the Y-Y axis of FIG. 14A at the seventh-intermediate fabrication stage, according to an illustrative alternative embodiment.

FIGS. 20A and 20B illustrate semiconductor structure 200 at a seventh-intermediate fabrication stage. During this stage, a sacrificial material 222 is deposited on the recessed source/drain region 216 and on the exterior surfaces of sidewall spacer 214 and gate hardmask 212 to pinch-off the recessed source/drain region 216 as depicted in FIG. 20A. In addition, sacrificial material 222 is also deposited on the recessed source/drain region 216 and on the exterior surfaces of sidewall spacer 214 and STI region 201 as depicted in FIG. 20B. Sacrificial material 222 can be deposited in a similar manner and be of a similar material as discussed above for sacrificial material 122.

Figures 21A, 21B:
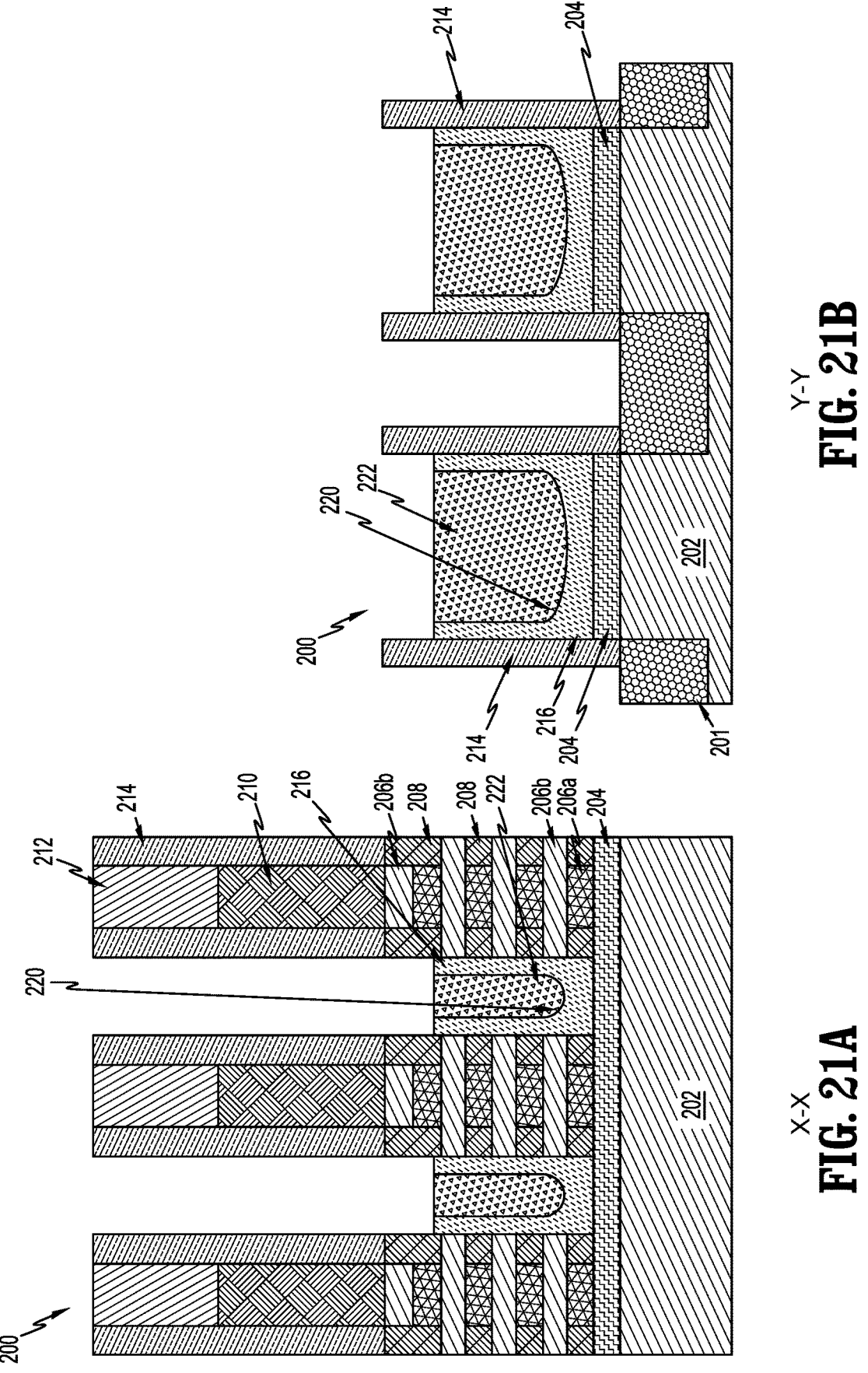
FIG. 21A is a cross-sectional view illustrating the semiconductor structure taken along the X-X axis of FIG. 14A at an eighth-intermediate fabrication stage, according to an illustrative alternative embodiment.
FIG. 21B is a cross-sectional view of the semiconductor structure taken along the Y-Y axis of FIG. 14A at the eighth-intermediate fabrication stage, according to an illustrative alternative embodiment.

FIGS. 21A and 21B illustrate semiconductor structure 200 at an eighth-intermediate fabrication stage. During this stage, a portion of sacrificial material 222 is removed from sidewall spacer 214 and is coplanar with the top surface of recessed source/drain region 216 as depicted in FIG. 21A. In addition, a portion of sacrificial material 222 is removed from sidewall spacer 214 and the top of STI region 201, leaving sacrificial material 222 on the recessed source/drain region 216 and coplanar with the top surface of source/drain region 216 as depicted in FIG. 21B. The portion of sacrificial material 222 can be removed by one or more wet or dry etching processes.

Figures 22A, 22B:
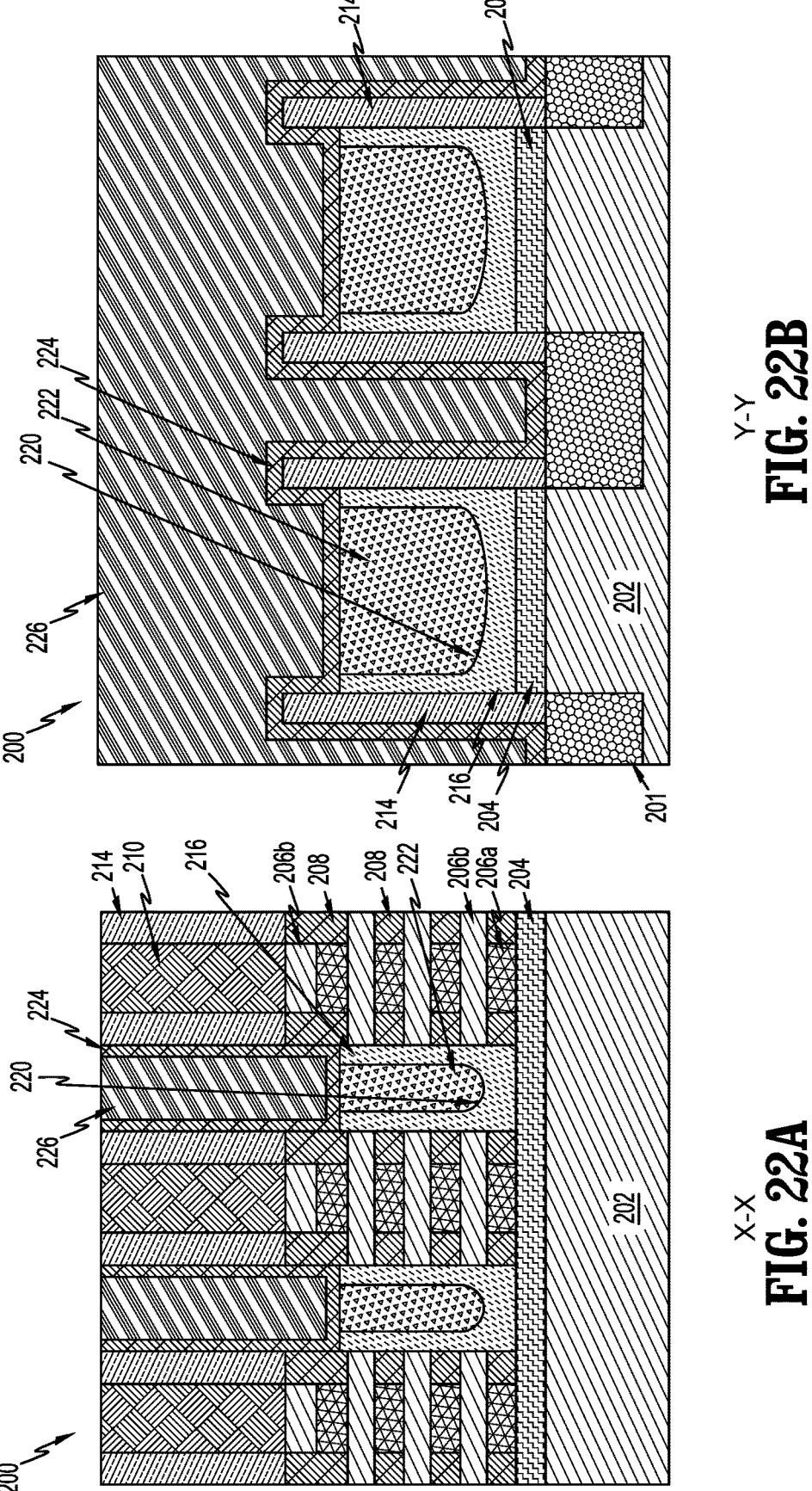
FIG. 22A is a cross-sectional view illustrating the semiconductor structure taken along the X-X axis of FIG. 14A at a ninth-intermediate fabrication stage, according to an illustrative alternative embodiment.
FIG. 22B is a cross-sectional view of the semiconductor structure taken along the Y-Y axis of FIG. 14A at the ninth-intermediate fabrication stage, according to an illustrative alternative embodiment.

FIGS. 22A and 22B illustrate semiconductor structure 200 at a ninth-intermediate fabrication stage. During this stage, a etch stop liner layer 224 is formed on sacrificial material 222, recessed source/drain region 216 and sidewall spacer 214 as depicted in FIG. 22A. In addition, etch stop liner layer 224 is also formed on sacrificial material 222, sidewall spacer 214 and STI region 201 as depicted in FIG. 22B. An ILD layer 226 is then deposited on etch stop liner layer 224. The etch stop liner layer 224 and ILD layer 226 can be deposited in a similar manner and be of a similar material as discussed above for etch stop liner layer 124 and ILD layer 126. ILD layer 226 can be planarized by, for example, a planarization process such as CMP, which removes the gate hardmask 212 and exposes a top surface of the dummy gate 210.

Figures 23A, 23B:
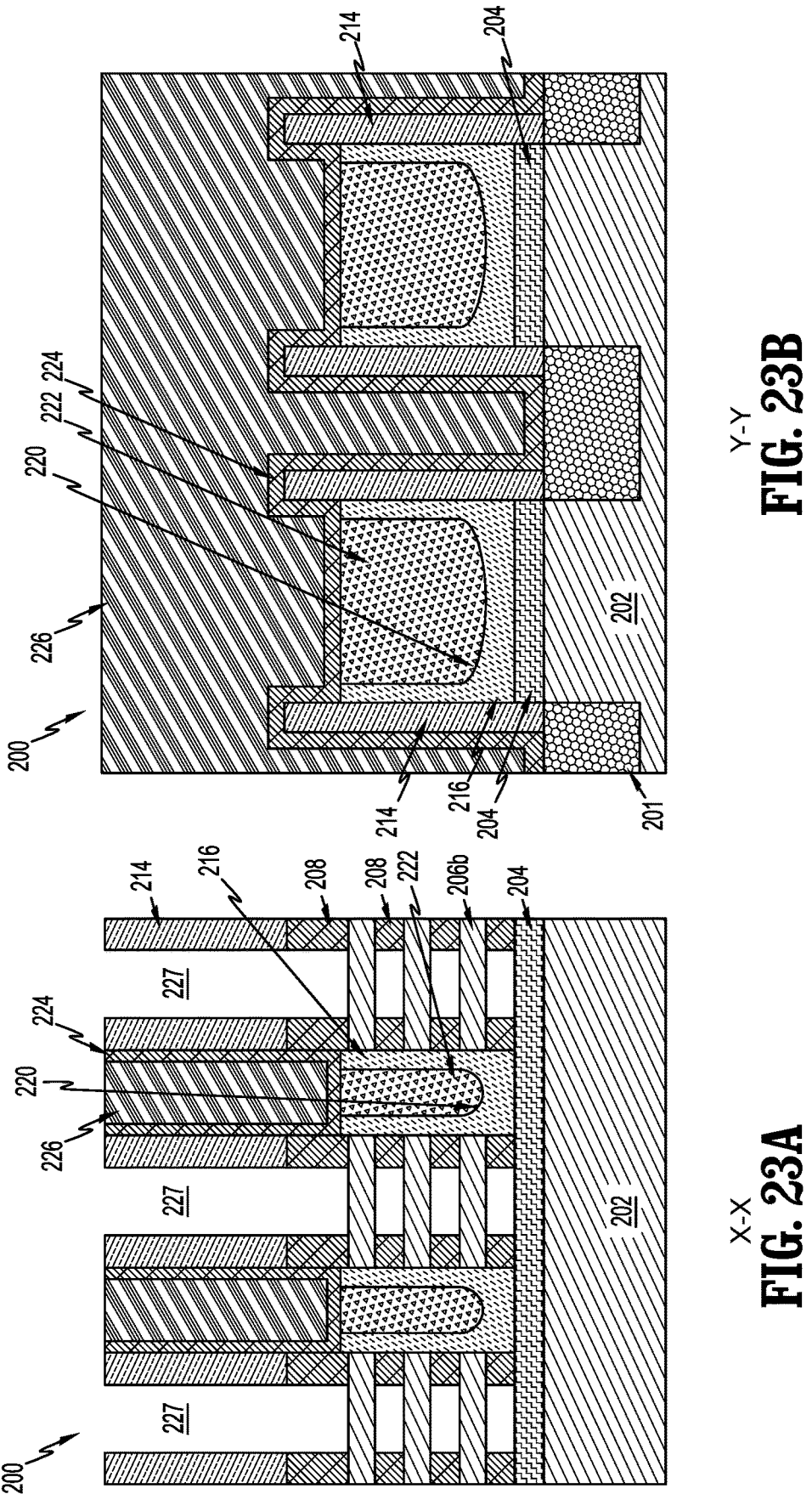
FIG. 23A is a cross-sectional view illustrating the semiconductor structure taken along the X-X axis of FIG. 14A at a tenth-intermediate fabrication stage, according to an illustrative alternative embodiment.
FIG. 23B is a cross-sectional view of the semiconductor structure taken along the Y-Y axis of FIG. 14A at the tenth-intermediate fabrication stage, according to an illustrative embodiment.

FIGS. 23A and 23B illustrate semiconductor structure 200 at a tenth-intermediate fabrication stage. During this stage, FIG. 23A depicts the semiconductor structure 200 after one or more wet or dry etching processes were performed to remove the dummy gate 210, top-most channel layer 206b and sacrificial layers 206a to thereby define a gate cavity 227 where a replacement gate structure will subsequently be formed for the semiconductor structure 200.

Figures 24A, 24B:
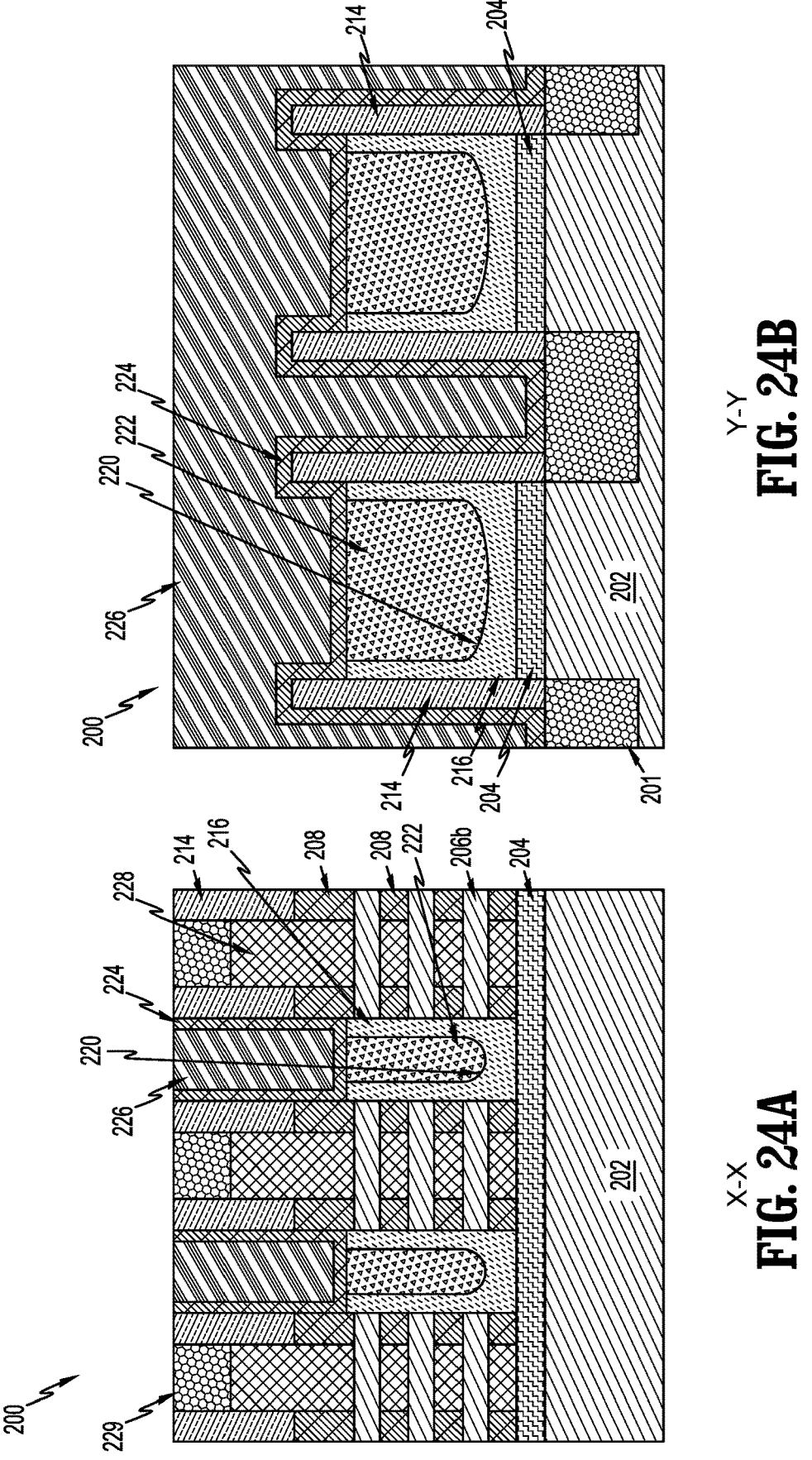
FIG. 24A is a cross-sectional view illustrating the semiconductor structure taken along the X-X axis of FIG. 14A at an eleventh-intermediate fabrication stage, according to an illustrative alternative embodiment.
FIG. 24B is a cross-sectional view of the semiconductor structure taken along the Y-Y axis of FIG. 14A at the eleventh-intermediate fabrication stage, according to an illustrative alternative embodiment.

FIGS. 24A and 24B illustrate semiconductor structure 200 at an eleventh-intermediate fabrication stage. During this stage, replacement gate structure 228 is formed in the gate cavity 227. The replacement gate structure 228 depicted herein is intended to be representative in nature of any type of gate structure that may be employed in manufacturing integrated circuit products using so-called gate-last (replacement gate) manufacturing techniques. The replacement gate structure 228 can be the same as discussed above for replacement gate structure 128.

Next, a SAC cap material 229 may be deposited on the replacement gate structure 228 and sidewall spacer 214. The SAC cap material 229 can be deposited in a similar manner and be of a similar material as discussed above for SAC cap material 129.

Figures 25A, 25B:
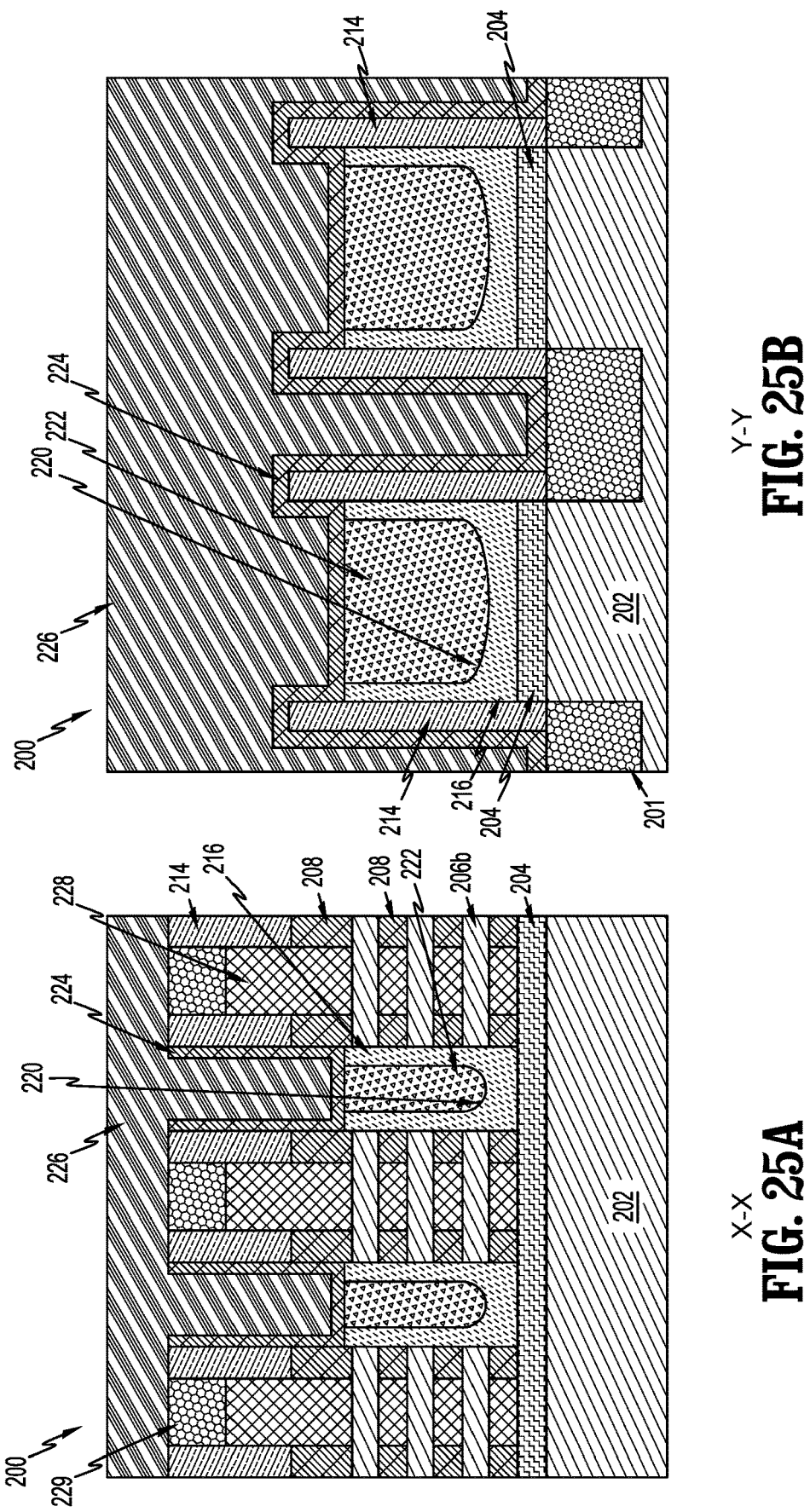
FIG. 25A is a cross-sectional view illustrating the semiconductor structure taken along the X-X axis of FIG. 14A at a twelfth-intermediate fabrication stage, according to an illustrative alternative embodiment.
FIG. 25B is a cross-sectional view of the semiconductor structure taken along the Y-Y axis of FIG. 14A at the twelfth-intermediate fabrication stage, according to an illustrative alternative embodiment.

FIGS. 25A and 25B illustrate semiconductor structure 200 at a twelfth-intermediate fabrication stage. During this stage, an additional ILD layer 226 is deposited on ILD layer 226 as well as sidewall spacer 214 and SAC cap layer 229 using the techniques discussed above.

Figures 26A, 26B:
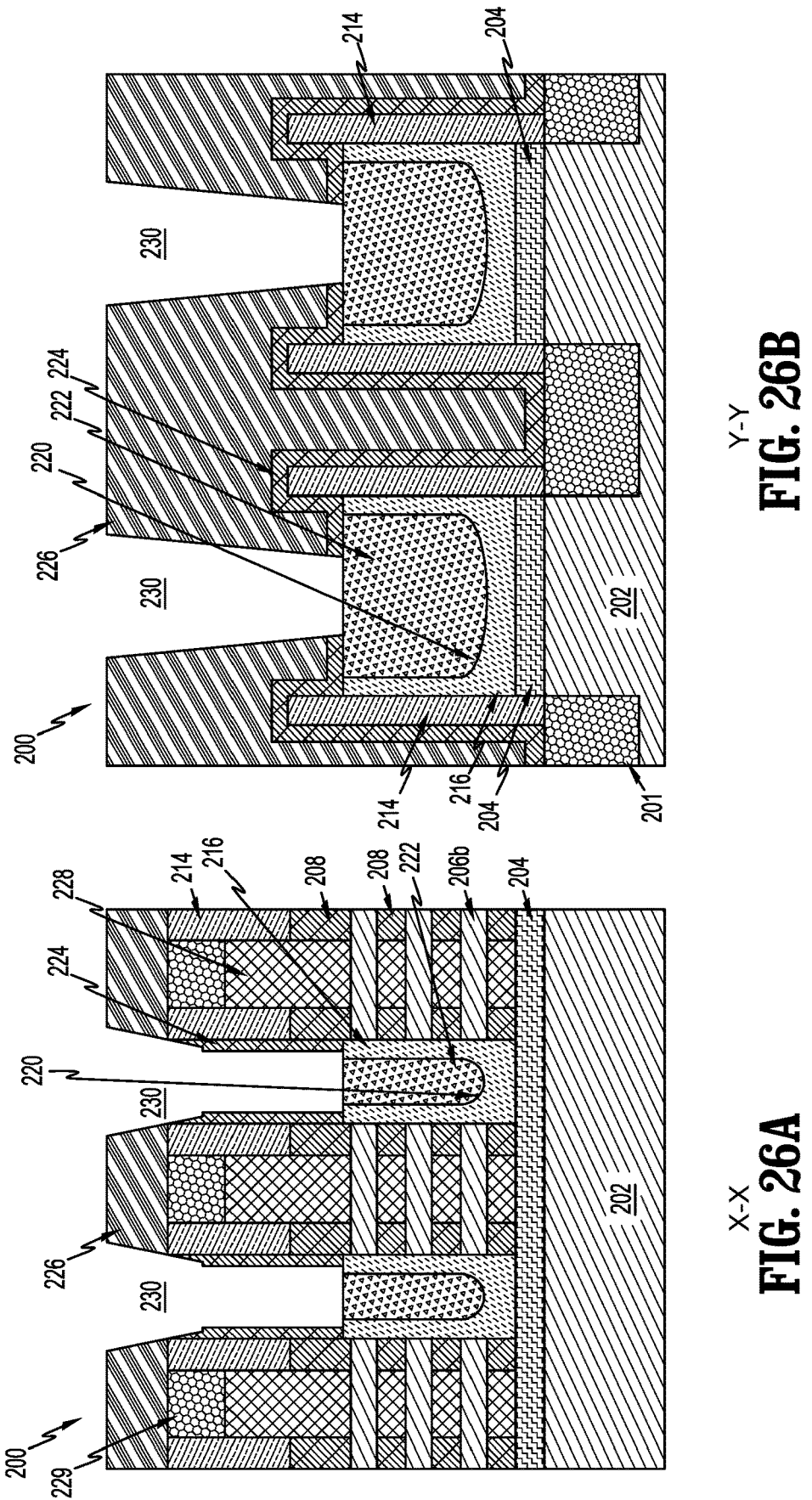
FIG. 26A is a cross-sectional view illustrating the semiconductor structure taken along the X-X axis of FIG. 14A at a thirteenth-intermediate fabrication stage, according to an illustrative alternative embodiment.
FIG. 26B is a cross-sectional view of the semiconductor structure taken along the Y-Y axis of FIG. 14A at the thirteenth-intermediate fabrication stage, according to an illustrative embodiment.

FIGS. 26A and 26B illustrate semiconductor structure 200 at a thirteenth-intermediate fabrication stage. During this stage, source/drain contact regions 230 are formed by, conventional lithographic and etch processes in the ILD layer 226 on etch stop liner layer 224, followed by etch stop liner layer 224 being removed to expose a top surface of sacrificial material 222. As depicted in FIG. 26B, a portion of the top surface of sacrificial material 222 remains unexposed under etch stop liner layer 224 and ILD layer 226.

Figures 27A, 27B:
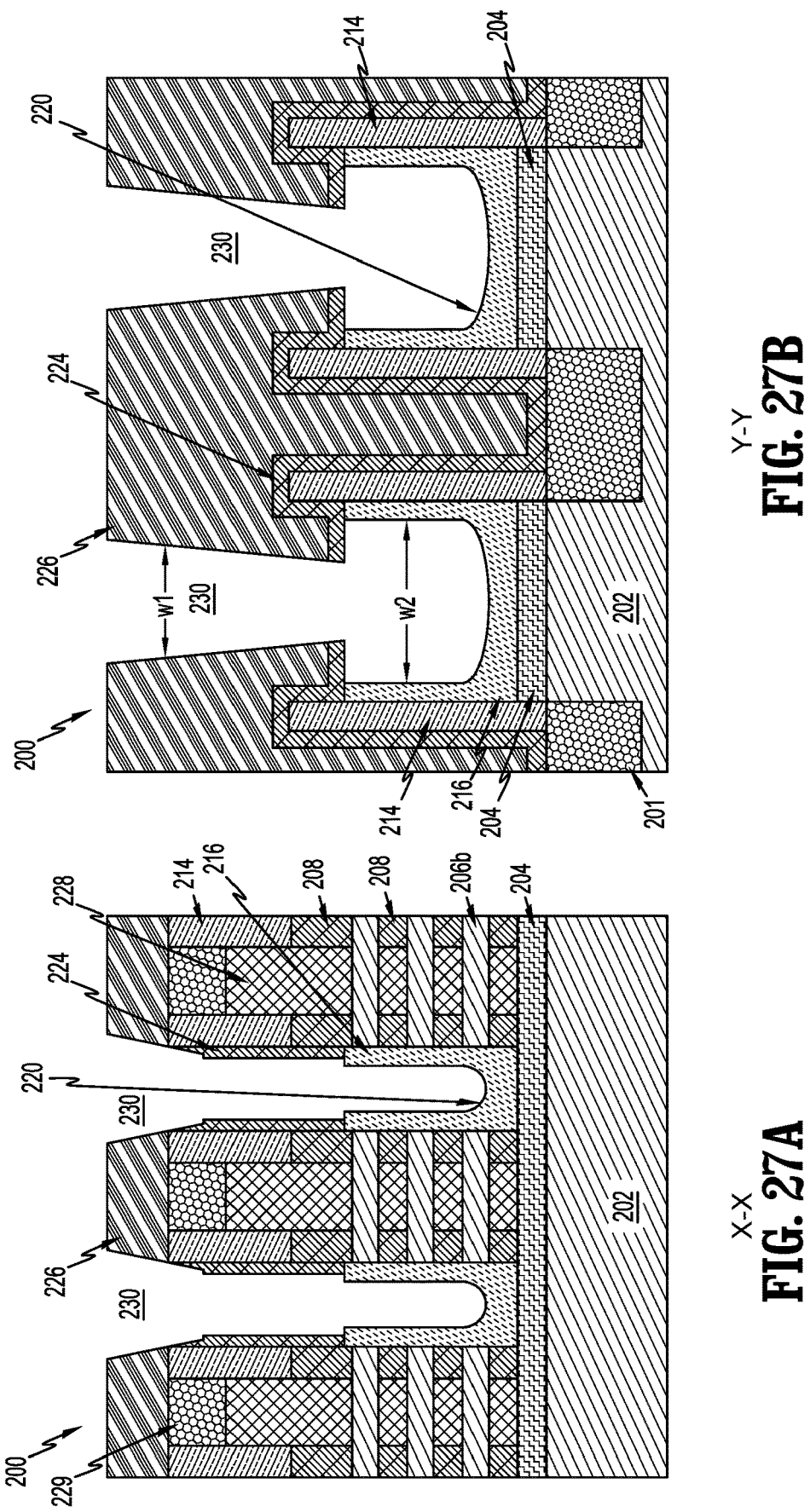
FIG. 27A is a cross-sectional view illustrating the semiconductor structure taken along the X-X axis of FIG. 14A at a fourteenth-intermediate fabrication stage, according to an illustrative alternative embodiment.
FIG. 27B is a cross-sectional view of the semiconductor structure taken along the Y-Y axis of FIG. 14A at the fourteenth-intermediate fabrication stage, according to an illustrative embodiment.

FIGS. 27A and 27B illustrate semiconductor structure 200 at a fourteenth-intermediate fabrication stage. During this stage, the sacrificial material 222 is removed to further extend source/drain contact regions 230 using a selective etch such as an isotropic etch to expose the exterior surface of recessed source/drain region 216. In an illustrative embodiment, a width of a top portion of S/D contact regions 230 denoted w1 is less than a width of a bottom portion of source/drain contact regions 230 denoted as w2. In an illustrative embodiment, a width (w1) of a portion of source/drain contact regions 230 above a top surface of etch stop liner layer 224 is less than a width (w2) of a portion of metal contact regions 230 below a bottom surface of etch stop liner layer 224 and extending down to the recessed source/drain region 216.

Figures 28A, 28B:
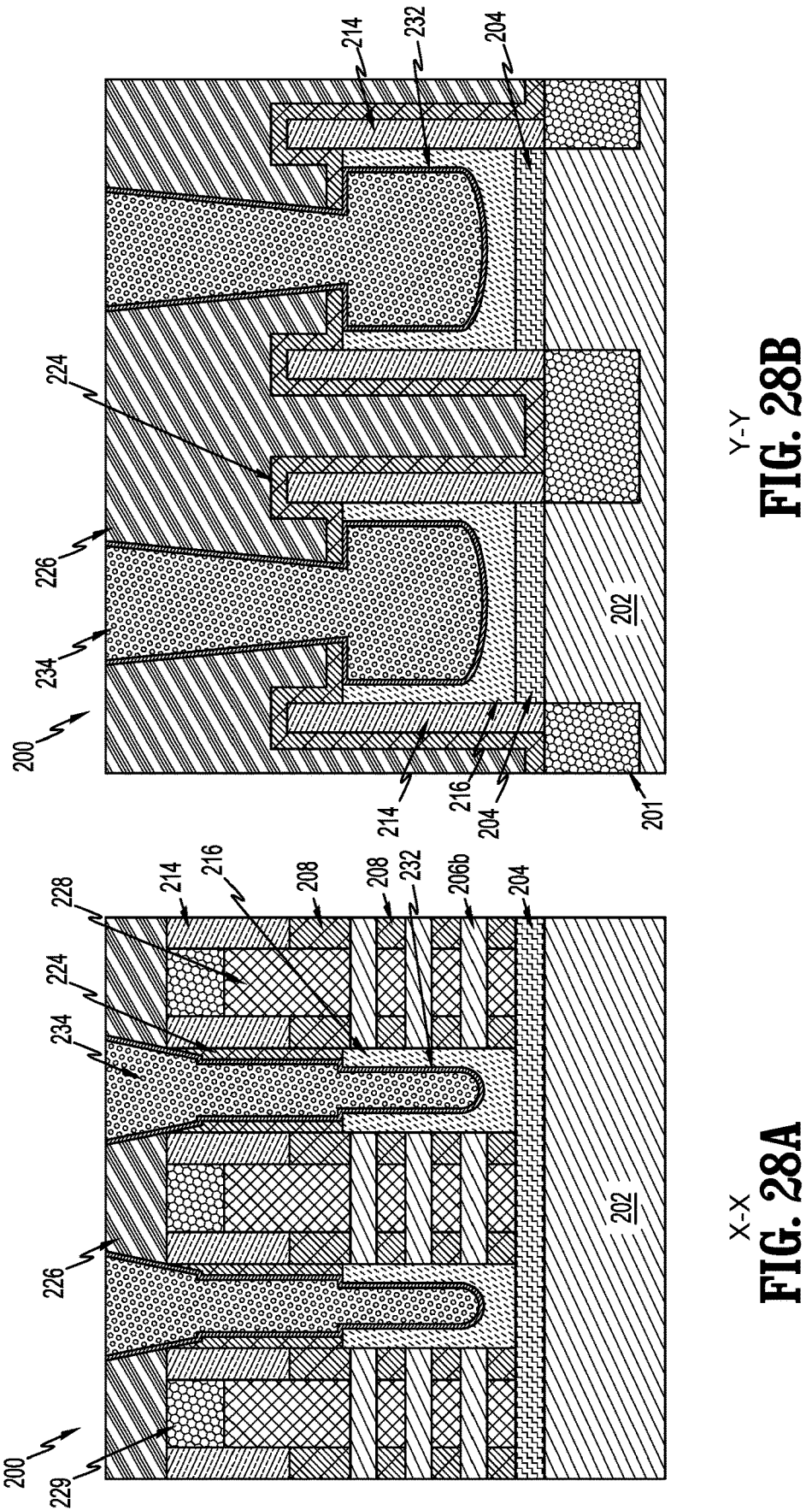
FIG. 28A is a cross-sectional view illustrating the semiconductor structure taken along the X-X axis of FIG. 14A at a fifteenth-intermediate fabrication stage, according to an illustrative alternative embodiment.
FIG. 28B is a cross-sectional view of the semiconductor structure taken along the Y-Y axis of FIG. 14A at the fifteenth-intermediate fabrication stage, according to an illustrative embodiment.

FIGS. 28A and 28B illustrate semiconductor structure 200 at a fifteenth-intermediate fabrication stage. During this stage, a metal-containing liner (i.e., metal/metal-silicide layer) 232 is formed on the exposed surfaces of recessed source/drain region 216, etch stop liner layer 224 and ILD layer 226 in metal contact regions 230. The metal-containing liner 232 can be formed in a similar manner and be of a similar material as discussed above for metal-containing liner 132.

Next, a high conductance metal 234 is deposited in source/drain contact region 230 and on metal-containing liner 232. The high conductance metal 234 can be deposited in a similar manner and be of a similar material as discussed above for high conductance metal 134. The high conductance metal 234 can be planarized using, for example, a planarizing process such as CMP.

It is to be understood that the methods discussed herein for fabricating semiconductor structures can be incorporated within semiconductor processing flows for fabricating other types of semiconductor structures and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with non-limiting illustrative embodiments can be employed in applications, hardware, and/or electronic systems. Suitable hardware and systems for implementing the non-limiting illustrative embodiments may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the non-limiting illustrative embodiments provided herein, one of ordinary skill in the art will be able to contemplate other implementations and applications of the techniques described herein.

Although illustrative embodiments have been described herein with reference to the accompanying drawings, it is to be understood that the illustrative embodiments are not limited to those precise embodiments, and that various other changes and modifications may be made by one skilled in art without departing from the scope or spirit of the illustrative embodiments.

What is claimed is:

1. A semiconductor structure, comprising:
a source/drain region having a top surface and a bottom surface, the top surface of the source/drain region comprising a recessed portion within the source/drain region and the bottom surface being disposed on a bottom dielectric isolation layer;
a metal contact having a first portion and a second portion, wherein the first portion of the metal contact has a first width and the second portion of the metal contact has a second width greater than the first width, wherein at least a portion of the second portion of the metal contact is disposed in the recessed portion within the source/drain region; and
a sidewall spacer disposed on sidewalls of the bottom dielectric isolation layer and the source/drain region;
wherein the bottom surface of the source/drain region and the bottom dielectric isolation layer are continuous between the sidewall spacer disposed on the sidewalls of the bottom dielectric isolation layer and the source/drain region.

2. The semiconductor structure according to claim 1, wherein a top surface of the second portion of the metal contact extends above the top surface of the source/drain region.

3. The semiconductor structure according to claim 2, wherein the sidewall spacer is further disposed on sidewalls of the second portion of the metal contact.

4. The semiconductor structure according to claim 1, wherein a top surface of the second portion of the metal contact is coplanar with the top surface of the source/drain region.

5. The semiconductor structure according to claim 1, wherein the recessed portion of the source/drain region is one of a u-shaped surface or a v-shaped surface.

6. The semiconductor structure according to claim 1, further comprising the source/drain region disposed between a first channel region and a second channel region.

7. An integrated circuit, comprising:
a plurality of semiconductor structures, wherein at least one of the plurality of semiconductor structures comprises:
a source/drain region having a top surface and a bottom surface, the top surface of the source/drain region comprising a recessed portion within the source/drain region and the bottom surface being disposed on a bottom dielectric isolation layer;
a metal contact having a first portion and a second portion, wherein the first portion of the metal contact has a first width and the second portion of the metal contact has a second width greater than the first width, wherein at least a portion of the second portion of the metal contact is disposed in the recessed portion within the source/drain region; and
a sidewall spacer disposed on sidewalls of the bottom dielectric isolation layer and the source/drain region;
wherein the bottom surface of the source/drain region and the bottom dielectric isolation layer are continuous between the sidewall spacer disposed on the sidewalls of the bottom dielectric isolation layer and the source/drain region.

8. The integrated circuit according to claim 7, wherein a top surface of the second portion of the metal contact extends above the top surface of the source/drain region.

9. The integrated circuit according to claim 8, wherein the sidewall spacer is further disposed on sidewalls of the second portion of the metal contact.

10. The integrated circuit according to claim 7, wherein a top surface of the second portion of the metal contact is coplanar with the top surface of the source/drain region.

11. The integrated circuit according to claim 7, wherein the recessed portion of the source/drain region is one of a u-shaped surface or a v-shaped surface.

12. The integrated circuit according to claim 7, wherein the at least one of the plurality of semiconductor structures further comprises the source/drain region disposed between a first channel region and a second channel region.

13. A method, comprising:

forming a source/drain region having a top surface and a bottom surface, the top surface of the source/drain region comprising a recessed portion within the source/drain region and the bottom surface being disposed on a bottom dielectric isolation layer;

forming a metal contact in the source/drain region, the metal contact having a first portion and a second portion, wherein the first portion of the metal contact has a first width and the second portion of the metal contact has a second width greater than the first width, wherein at least a portion of the second portion of the metal contact is formed in the recessed portion within the source/drain region; and forming a sidewall spacer on sidewalls of the bottom dielectric isolation layer and the source/drain region;

wherein the bottom surface of the source/drain region and the bottom dielectric isolation layer are continuous between the sidewall spacer disposed on the sidewalls of the bottom dielectric isolation layer and the source/drain region.

14. The method according to claim 13, wherein a top surface of the second portion of the metal contact extends above the top surface of the source/drain region.

15. The method according to claim 14, further comprising forming the sidewall spacer on sidewalls of the second portion of the metal contact.

16. The method according to claim 13, wherein a top surface of the second portion of the metal contact is coplanar with the top surface of the source/drain region.

17. The semiconductor structure according to claim 1, further comprising a metal-containing liner disposed on the metal contact.

18. The integrated circuit according to claim 7, wherein the at least one of the plurality of semiconductor structures further comprises a metal-containing liner disposed on the metal contact.

19. The method according to claim 13, wherein the recessed portion of the source/drain region is one of a u-shaped surface or a v-shaped surface.

20. The method according to claim 13, further comprising forming the source/drain region between a first channel region and a second channel region.

* * * * *